United States Patent
Zhu

(10) Patent No.: US 8,178,873 B2
(45) Date of Patent: May 15, 2012

(54) SOLUTION PROCESSABLE ORGANIC SEMICONDUCTORS

(75) Inventor: Peiwang Zhu, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 203 days.

(21) Appl. No.: 12/808,003

(22) PCT Filed: Nov. 20, 2008

(86) PCT No.: PCT/US2008/084122
§ 371 (c)(1),
(2), (4) Date: Jun. 14, 2010

(87) PCT Pub. No.: WO2009/079150
PCT Pub. Date: Jun. 25, 2009

(65) Prior Publication Data
US 2010/0270542 A1    Oct. 28, 2010

Related U.S. Application Data

(60) Provisional application No. 61/014,101, filed on Dec. 17, 2007.

(51) Int. Cl.
*H01L 51/30* (2006.01)
*C08K 5/45* (2006.01)

(52) U.S. Cl. ........ 257/40; 257/E51.024; 257/E51.025; 438/99; 524/84

(58) Field of Classification Search ........... 257/40, 257/E51.025; 438/99; 524/84
See application file for complete search history.

(56) References Cited

U.S. PATENT DOCUMENTS

| | | | |
|---|---|---|---|
| 6,433,359 B1 | 8/2002 | Kelley | |
| 6,617,609 B2 | 9/2003 | Kelley | |
| 6,946,676 B2 | 9/2005 | Kelley | |
| 7,319,153 B2 | 1/2008 | Vogel | |
| 7,495,251 B2 | 2/2009 | Zhu | |
| 7,576,208 B2* | 8/2009 | Brown et al. | 546/49 |
| 7,666,968 B2 | 2/2010 | Zhu | |
| 7,667,230 B2* | 2/2010 | Zhu et al. | 257/40 |
| 7,807,993 B2* | 10/2010 | Brown et al. | 257/40 |
| 2005/0035333 A1 | 2/2005 | Gerlach | |
| 2005/0287728 A1 | 12/2005 | Arias | |
| 2007/0137520 A1 | 6/2007 | Brown | |

(Continued)

FOREIGN PATENT DOCUMENTS
EP    1783781    5/2007

(Continued)

OTHER PUBLICATIONS

Ando, "Novel p- and n-Type Organic Semiconductors with an Anthracene Unit", Chemistry of Materials, Mar. 22, 2005, vol. 17, No. 6, pp. 1261-1264.

(Continued)

*Primary Examiner* — Victor A Mandala
(74) *Attorney, Agent, or Firm* — Jean A. Lown

(57) ABSTRACT

Semiconductor devices, methods of making semiconductor devices, and coating compositions that can be used to provide a semiconductor layer within a semiconductor device are described. The coating compositions include a small molecule semiconductor, an insulating polymer, and an organic solvent that can dissolve both the small molecule semiconductor material and the insulating polymer. The small molecule semiconductor is an anthracene-based compound (i.e., anthracene derivative) substituted with two thiophene groups as well as with two silylethynyl groups.

22 Claims, 2 Drawing Sheets

U.S. PATENT DOCUMENTS

| | | | |
|---|---|---|---|
| 2007/0249087 A1* | 10/2007 | Zhu et al. | 438/99 |
| 2010/0025661 A1* | 2/2010 | Wang et al. | 257/40 |
| 2010/0159691 A1* | 6/2010 | Tsutsui | 438/613 |
| 2010/0227956 A1* | 9/2010 | Brown et al. | 524/84 |
| 2010/0270542 A1 | 10/2010 | Zhu | |
| 2011/0065260 A1* | 3/2011 | Kawamori et al. | 438/464 |
| 2011/0079775 A1 | 4/2011 | Zhu | |
| 2011/0186836 A1* | 8/2011 | Herron et al. | 257/40 |
| 2011/0204351 A1* | 8/2011 | Heim et al. | 257/40 |

FOREIGN PATENT DOCUMENTS

| | | |
|---|---|---|
| JP | 2007/088115 | 4/2007 |
| WO | WO 03/095445 | 11/2003 |
| WO | WO 2006/050496 | 5/2006 |
| WO | WO 2006/119853 | 11/2006 |
| WO | WO 2007/124286 | 11/2007 |
| WO | WO 2008/107089 | 9/2008 |
| WO | WO 2008/120839 | 10/2008 |
| WO | WO 2008/128618 | 10/2008 |
| WO | WO 2008/143440 | 11/2008 |

OTHER PUBLICATIONS

Anthony, "Functionalized Pentacene: Improved Electronic Properties from Control of Solid-State Order", Journal of the American Chemical Society, Sep. 26, 2001, vol. 123, No. 38, pp. 9482-9483.

Anthony, "Functionalized Acenes and Heteroacenes for Organic Electronics", Chem. Rev., Dec. 2006, vol. 106, No. 12, pp. 5028-5048.

Chung, "All-organic solution-processed two-terminal transistors fabricated using the photoinduced p-channels", Applied Physics Letters, 2009, vol. 94, No. 043303, pp. 043303-1-043303-3 (XP009118641).

Ito, "Oligo(2,6-anthrylene)s: Acene-Oligomer Approach for Organic Field-Effect Transistors", Angewandte Chemie International Edition, Mar. 10, 2003, vol. 42, No. 10, pp. 1159-1162.

Loewe, "Regioregular, Head-to-Tail Coupled Poly(3-alkylthiophenes) Made Easy by the GRIM Method: Investigation of the Reaction and the Origin of Regioselectivity", Macromolecules, Jun. 19, 2001, vol. 34, No. 13, pp. 4324-4333.

McCullough, "Design, Synthesis, and Control of Conducting Polymer Architectures: Structurally Homogeneous Poly(3-alkylthiophenes)", Journal of Organic Chemistry, Feb. 1993, vol. 58, No. 4, 904-912.

Meng, "High-Performance, Stable Organic Thin-Film Field-Effect Transistors Based on Bis-5'-alkylthiophen-2'-yl-2,6-anthracene Semiconductors", Journal of the American Chemical Society, Mar. 2, 2005, vol. 127, No. 8, pp. 2406-2407.

Sze, "Physics of Semiconductor Devices", Second Edition, John Wiley & Sons, Inc. (1981).

Vidal, "π-Conjugated Ligand Polymers Entwined Around Copper Centres", Chem. Eur. J., May 2, 2000, vol. 6, Issue 9, pp. 1663-1673.

Yamada, "Effective photochemical synthesis of an air-stable anthracene-based organic semiconductor from its diketone precursor", Tetrahedron Letters, Oct. 2006, vol. 47, No. 42, pp. 7501-7504.

Zhai, "A Simple Method to Generate Side-Chain Derivatives of Regioregular Polythiophene via the GRIM Metathesis and Post-polymerization Functionalization", Macromolecules, Jan. 14, 2003, vol. 36, No. 1, pp. 61-64.

International Search Report for PCT/US2008/084122, 3 pgs.

\* cited by examiner

SOLUTION PROCESSABLE ORGANIC SEMICONDUCTORS

CROSS REFERENCE TO RELATED APPLICATIONS

This application is a national stage filing under 35 U.S.C. 371 of PCT/US2008/084122, filed Nov. 20, 2008, which claims priority to Provisional Application No. 61/014,101, filed Dec. 17, 2007, the disclosure of which is incorporated by reference in its/their entirety herein.

TECHNICAL FIELD

Semiconductor devices, methods of making semiconductor devices, and coating compositions that can be used to provide a semiconductor layer within a semiconductor device are described.

BACKGROUND ART

Traditionally, inorganic materials have dominated the semiconductor industry. For example, silicon arsenide and gallium arsenide have been used as semiconductor materials, silicon dioxide has been used as an insulator material, and metals such as aluminum and copper have been used as electrode materials. In recent years, however, there has been an increasing research effort aimed at using organic materials rather than the traditional inorganic materials in semiconductor devices. Among other benefits, the use of organic materials may enable lower cost manufacturing of electronic devices, may enable large area applications, and may enable the use of flexible circuit supports for display backplanes or integrated circuits.

A variety of organic semiconductor materials have been considered, the most common being fused aromatic ring compounds as exemplified by tetracene, pentacene, bis(acenyl) acetylene, and acene-thiophenes; oligomeric materials containing thiophene or fluorene units; and polymeric materials such as regioregular poly(3-alkylthiophene). At least some of these organic semiconductor materials have performance characteristics such as charge-carrier mobility, on/off current ratios, and sub-threshold voltages that are comparable or superior to those of amorphous silicon-based devices. Many of these materials need to be vapor deposited since they are not very soluble in most solvents.

Because of its good electronic performance characteristics, pentacene is often the organic semiconductor of choice. However, pentacene can be difficult to synthesize and purify. Because of the limited solubility of pentacene in many common solvents, semiconductor layers containing pentacene typically cannot be formed using solvent-based deposition techniques. As an additional complication for solvent-based deposition techniques, pentacene tends to oxidize or undergo dimerization reactions in many solutions. Once deposited in a semiconductor layer, pentacene can oxidize over time. This can lead to reduced performance or complete failure of the semiconductor device that contains the oxidized pentacene.

SUMMARY

Semiconductor devices, methods of making semiconductor devices, and coating compositions that can be used to provide a semiconductor layer within a semiconductor device are described. More specifically, the coating compositions include a small molecule semiconductor, an insulating polymer, and an organic solvent that can dissolve both the small molecule semiconductor and the insulating polymer. The small molecule semiconductor is an anthracene-based compound (i.e., anthracene derivative) that is substituted with two thiophene groups as well as with two silylethynyl groups.

In a first aspect, a coating composition is provided that includes (a) a small molecule semiconductor, (b) an insulating polymer, and (c) an organic solvent. The coating composition contains at least 0.1 weight percent dissolved small molecule semiconductor and at least 0.1 weight percent dissolved insulating polymer based on the total weight of the coating composition. The small molecule semiconductor is of Formula (I).

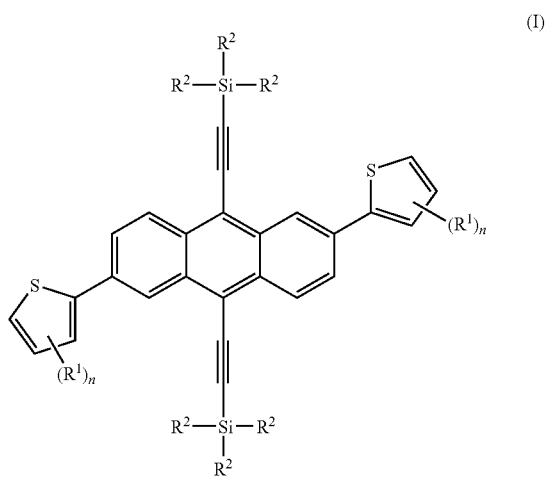

In Formula (I), each $R^1$ is independently alkyl, alkoxy, thioalkyl, hydroxyalkyl, heteroalkyl, alkenyl, alkynyl, aryl, aralkyl, halo, haloalkyl, trialkylsilyl, thienyl, formyl, acyl, alkoxycarbonyl, carboxy, aminocarbonyl, aminosulfonyl, or combination thereof; each n is independently an integer equal to 0, 1, 2, or 3; and each $R^2$ is independently alkyl, alkenyl, alkoxy, aryl, heteroaryl, aralkyl, heteroalkyl, heteroaralkyl, or hydroxyalkyl.

In a second aspect, a semiconductor device is provided. The semiconductor device contains a semiconductor layer that includes (a) a small molecule semiconductor of Formula (I) and (b) an insulating polymer.

In a third aspect, a method of making a semiconductor device is provided. The method includes providing a semiconductor layer that contains (a) a small molecule semiconductor of Formula (I) and (b) an insulating polymer.

The above summary of the present invention is not intended to describe each embodiment or every implementation of the present invention. The Figures, Detailed Description, and Examples that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
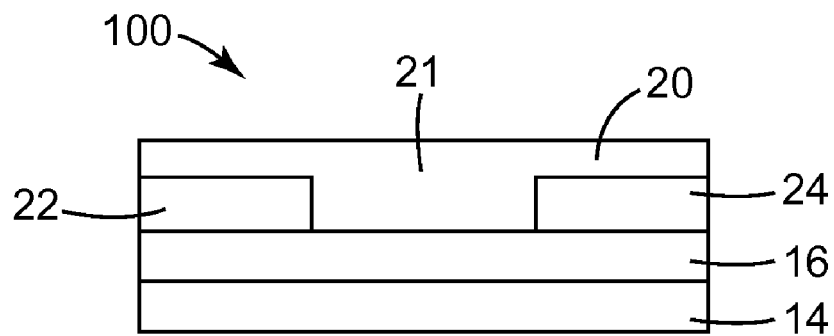
FIG. 1 schematically illustrates a first exemplary thin film transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION OF THE INVENTION

Coating compositions are provided that can be used to prepare a semiconductor layer within a semiconductor device such as a thin film transistor. All of the coating compositions and the semiconductor layers include both an insulating polymer and a small molecule semiconductor. The coating compositions also contain an organic solvent and at least a portion of the small molecule semiconductor and at least a portion of the insulating polymer are dissolved in the coating composition (e.g., dissolved in the organic solvent within the coating composition). The small molecule semiconductor is an anthracene derivative that is substituted with two thiophene groups as well as with two silylethynyl groups.

As used herein, the terms "a", "an", and "the" are used interchangeably with "at least one" to mean one or more of the elements being described.

The term "alkyl" refers to a monovalent group that is a radical of an alkane, which is a saturated hydrocarbon. The alkyl can be linear, branched, cyclic, or combinations thereof and typically contains 1 to 30 carbon atoms. In some embodiments, the alkyl group contains 1 to 20, 1 to 14, 1 to 10, 4 to 10, 4 to 8, 1 to 8, 1 to 6, or 1 to 4 carbon atoms. Examples of alkyl groups include, but are not limited to, methyl, ethyl, n-propyl, isopropyl, n-butyl, tert-butyl, iso-butyl, n-pentyl, n-hexyl, cyclohexyl, n-heptyl, n-octyl, and ethylhexyl.

The term "alkoxy" refers to a monovalent group of formula —OR where R is an alkyl group. Examples include methoxy, ethoxy, propoxy, butoxy, and the like.

The term "alkenyl" refers to a monovalent group that is a radical of an alkene, which is a hydrocarbon with at least one carbon-carbon double bond. The alkenyl can be linear, branched, cyclic, or combinations thereof and typically contains 2 to 30 carbon atoms. In some embodiments, the alkenyl contains 2 to 20, 2 to 14, 2 to 10, 4 to 10, 4 to 8, 2 to 8, 2 to 6, or 2 to 4 carbon atoms. Exemplary alkenyl groups include ethenyl, n-propenyl, and n-butenyl.

The term "alkynyl" refers to a monovalent group that is a radical of an alkyne, which is a hydrocarbon with at least one carbon-carbon triple bond. The alkynyl can be linear, branched, cyclic, or combinations thereof and typically contains 2 to 30 carbon atoms. In some embodiments, the alkynyl contains 2 to 20, 2 to 14, 2 to 10, 4 to 10, 4 to 8, 2 to 8, 2 to 6, or 2 to 4 carbon atoms. Exemplary alkynyl groups include ethynyl, n-propynyl, and n-butynyl.

The term "acyl" refers to a monovalent group of formula —(CO)—$R^b$ where $R^b$ is an alkyl, heteroalkyl, or aryl and the (CO) denotes that the carbon is attached to the oxygen with a double bond. An exemplary acyl group is acetyl where R is methyl. In some embodiments, the $R^b$ group can be substituted with at least one halo group. For example, any hydrogen of an alkyl, heteroalkyl, or aryl group can be replaced by a halo group.

The term "aryl" refers to a monovalent group that is a radical of an aromatic carbocyclic compound. The term "carbocyclic" refers to a ring structure in which all the ring atoms are carbon. The aryl can have one aromatic ring or can include up to 5 carbocyclic ring structures that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "aralkyl" refers to a monovalent group that is a radical of the compound R—Ar where Ar is an aromatic carbocyclic group and R is an alkyl group. The aralkyl is often an alkyl substituted with an aryl group.

The term "aminocarbonyl" refers to a monovalent group of formula —(CO)$NHR^a$ where $R^a$ is hydrogen, alkyl, or aryl.

The term "aminosulfonyl" refers to a monovalent group of formula —$SO2NHR^a$ where $R^a$ is hydrogen, alkyl, or aryl.

The term "carboxy" refers to a monovalent group of formula —(CO)OH where (CO) denotes that the carbon is attached to the oxygen with a double bond The term "alkoxycarbonyl" refers a monovalent group of formula —(CO)OR where (CO) denotes that the carbon is attached to the oxygen with a double bond and R is an alkyl.

The term "formyl" refers to a monovalent group of formula —(CO)H where the (CO) denotes that the carbon is attached to the oxygen with a double bond.

The term "halo" refers to a halogen group (i.e., —F, —Cl, —Br, or —I).

The term "haloalkyl" refers to an alkyl substituted with at least one halo group.

The term "hydroxyalkyl" refers to an alkyl substituted with at least one hydroxyl group.

"Heteroalkyl" refers to an alkyl having one or more —$CH_2$— groups replaced with a thio, oxy, a group of formula —$NR^b$— where $R^b$ is hydrogen or alkyl, heteroalkyl, or aryl, or a group of formula —$SiR_2$— where R is an alkyl. The heteroalkyl can be linear, branched, cyclic, or combinations thereof and can include up to 30 carbon atoms and up to 20 heteroatoms. In some embodiments, the heteroalkyl includes up to 25 carbon atoms, up to 20 carbon atoms, up to 15 carbon atoms, or up to 10 carbon atoms. Thioalkyl groups and alkoxy groups are subsets of heteroalkyl groups. Other heteroalkyl groups have a —$CH_2$— group on both sides of the thio, oxy, —$NR^b$—, or —$SiR_2$— group.

"Heteroaryl" refers to a monovalent radical having a five to seven member aromatic ring that includes one or more heteroatoms independently selected from S, O, N, or combinations thereof in the ring. Such a heteroaryl ring can be connected to or fused to up to five ring structures that are aromatic, aliphatic, or combinations thereof. Examples of heteroaryl groups include, but are not limited to, furanyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuranyl, benzothiophenyl, indolyl, carbazoyl, benzoxazolyl, benzothiazolyl, benzimidazolyl, cinnolinyl, quinazolinyl, quinoxalinyl, phthalazinyl, benzothiadazolyl, benzotriazinyl, phenazinyl, phenanthridinyl, acridinyl, and indazolyl, and the like.

"Heteroaralkyl" refers to an alkyl substituted with a heteroaryl.

"Silylethynyl" refers to a monovalent group of formula —C≡C—Si($R^a$)$_3$ where $R^a$ is independently selected from alkyl, alkoxy, alkenyl, heteroalkyl, hydroxyalkyl, aryl, aralkyl, heteroaryl, or heteroaralkyl. These groups are sometimes referred to as silanylethynyl groups.

The term "thienyl" refers to a monovalent, heterocyclic group of formula —$C_4H_3S$.

The term "thioalkyl" refers to a monovalent group of formula —SR where R is an alkyl.

The term "trialkylsilyl" refers to a monovalent group of formula —$SiR_3$ where each R is an alkyl.

The phrase "in the range of" includes the endpoints and all numbers between the endpoints. For example, the phrase in the range of 1 to 10 includes 1, 10, and all numbers between 1 and 10.

In a first aspect, a coating composition is provided that includes (a) a small molecule semiconductor, (b) an insulating polymer, and (c) an organic solvent. The coating composition contains at least 0.1 weight percent dissolved small molecule semiconductor and at least 0.1 weight percent dissolved insulating polymer based on the total weight of the coating composition. The small molecule semiconductor is of Formula (I).

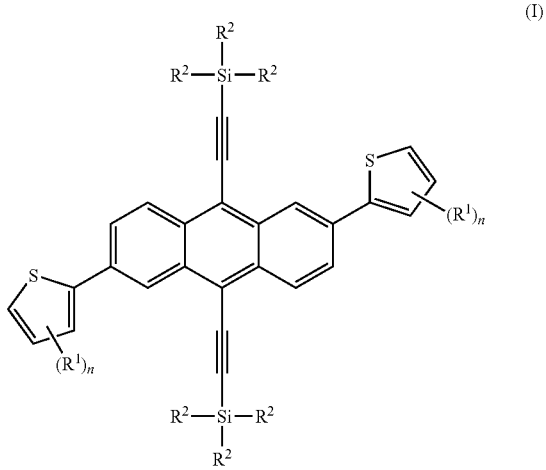

In Formula (I), each $R^1$ is independently alkyl, alkoxy, thioalkyl, hydroxyalkyl, heteroalkyl, alkenyl, alkynyl, aryl, aralkyl, halo, haloalkyl, trialkylsilyl, thienyl, formyl, acyl, alkoxycarbonyl, carboxy, aminocarbonyl, aminosulfonyl, or combination thereof. Each variable n is independently an integer equal to 0, 1, 2, or 3. Each $R^2$ in Formula (I) is independently, alkyl, alkoxy, alkenyl, aryl, heteroaryl, aralkyl, heteroalkyl, heteroaralkyl, or hydroxyalkyl.

As used herein, the term "small molecule" in reference to the semiconductor of Formula (I) means that the semiconductor is not a polymeric material. The small molecule semiconductor of Formula (I) is an anthracene derivative that is substituted with two thiophene groups as well as with two silylethynyl groups.

The two thiophene groups of the small molecule semiconductor can each independently be unsubstituted (i.e., n is equal to 0) or substituted with up to three $R^1$ groups (i.e., n is equal to 1, 2, or 3). Each $R^1$ group is independently selected from alkyl, alkoxy, thioalkyl, hydroxyalkyl, heteroalkyl, alkenyl, alkynyl, aryl, aralkyl, halo, haloalkyl, trialkylsilyl, thienyl, formyl, acyl, alkoxycarbonyl, carboxy, aminocarbonyl, aminosulfonyl, or combination thereof As used in reference to group $R^1$, the term "combinations thereof" refer to the substitution of one suitable $R^1$ group by another suitable $R^1$ group. For example, an alkyl, alkoxy, thioalkyl, hydroxyalkyl, heteroalkyl, alkenyl, alkynyl, aryl, aralkyl, trialkylsilyl, thienyl, or acyl can be substituted with a halo such a fluoro. In some examples, all or a portion of the hydrogens of $R^1$ are substituted with fluoro.

Exemplary alkyl, alkoxy, thioalkyl, hydroxyalkyl, heteroalkyl, alkenyl, and alkynyl groups can be linear, cyclic, or a combination thereof and usually have up to 10 carbon atoms, up to 8 carbon atoms, up to 6 carbon atoms, or up to 4 carbon atoms. An exemplary aryl group is phenyl and an exemplary aralkyl is an alkyl group with up to 10 carbon atoms that is substituted with a phenyl group. Exemplary heteroaryl groups often have a 5 or 6 membered saturated or unsaturated heterocyclic ring that includes 1 or 2 heteroatoms. Exemplary heteroaralkyl groups have an alkyl having up to 10 carbon atoms that is substituted with a 5 or 6 membered heteroaryl having 1 or 2 heteroatoms. Each alkyl group of exemplary trialkylsilyl groups have up to 10 carbon atoms, up to 8 carbon atoms, up to 6 carbon atoms, or up to 4 carbon atoms. Exemplary acyl groups of formula —(CO)$R^b$ have a $R^b$ group that is an alkyl group with up to 10 carbon atoms or a $R^b$ group that is a heteroalkyl with up to 10 carbon atoms, up to 8 carbon atoms, up to 6 carbon atoms, or up to 4 carbon atoms. The heteroalkyl group often has an oxy group as the heteroatom.

In many embodiments of the small molecule semiconductor according to Formula (I), there is a single $R^1$ group on each thienyl group. That is, the compounds of Formula (I) are often of Formula (II), (III), or (IV).

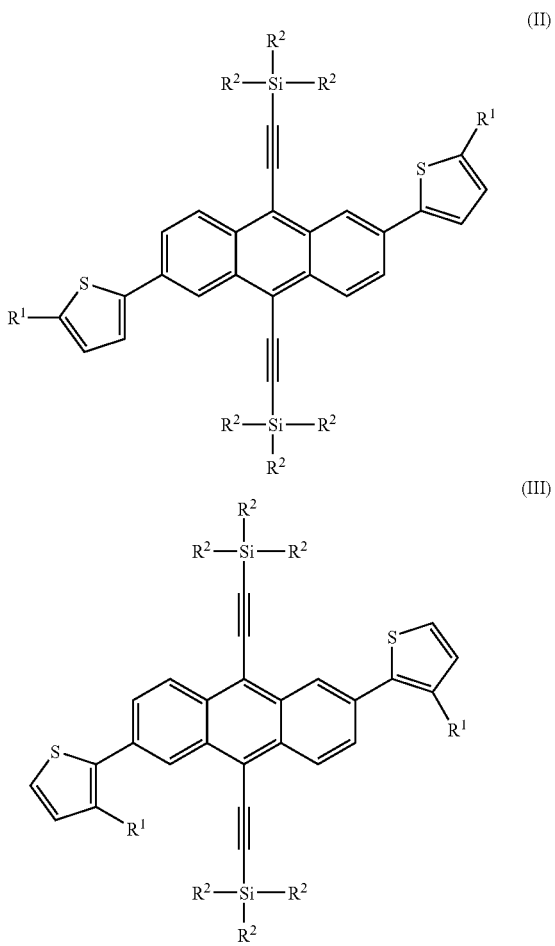

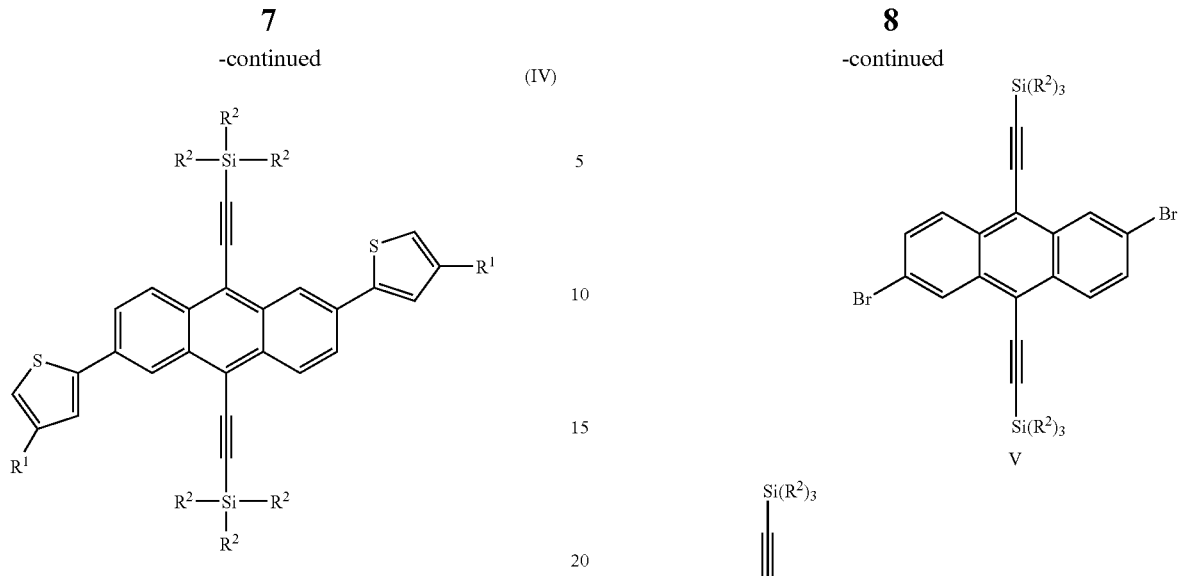

In some small molecule semiconductors of Formula (II), (III), or (IV), each group $R^1$ is an alkyl having up to 10 carbon atoms, a heteroaryl such as thienyl, an acyl group having up to 10 carbon atoms, or a formyl group.

Each of the silylethynyl group in the small molecule semiconductor of Formula (I) is of formula —C≡C—Si—$(R^2)_3$ where each $R^2$ is independently alkyl, alkoxy, alkenyl, aryl, heteroaryl, aralkyl, heteroalkyl, heteroaralkyl, or hydroxyalkyl. Exemplary alkyl, alkenyl, heteroalkyl, and hydroxyalkyl groups can be linear, branched, cyclic, or a combination thereof and usually have up to 10 carbon atoms, up to 8 carbon atoms, up to 6 carbon atoms, or up to 4 carbon atoms. An exemplary aryl group is phenyl and an exemplary aralkyl is an alkyl having up to 10 carbon atoms that is substituted with a phenyl group. Exemplary heteroaryl groups often have a 5 or 6 membered unsaturated, heterocyclic ring that includes 1 or 2 heteroatoms. Exemplary heteroaralkyl groups have an alkyl having up to 10 carbon atoms that is substituted with a 5 or 6 membered heteroaryl having 1 or 2 heteroatoms.

In more specific examples, each $R^2$ is an alkyl having up to 10, up to 8, or up to 6 carbon atoms. That is, the silylethynyl group is a trialkylsilylethynyl group. Each alkyl group often has at least 1 carbon atom, at least 2 carbon atoms, or at least 3 carbon atoms. For example, in some copolymers of Formula (I), the silylethynyl group is triisopropylsilylethynyl where each $R^2$ is isopropyl.

The small molecule semiconductor of Formula (I) can be prepared by any known synthesis method. For example, the semiconductor can be prepared as shown in Reaction Scheme A.

Reaction Scheme A

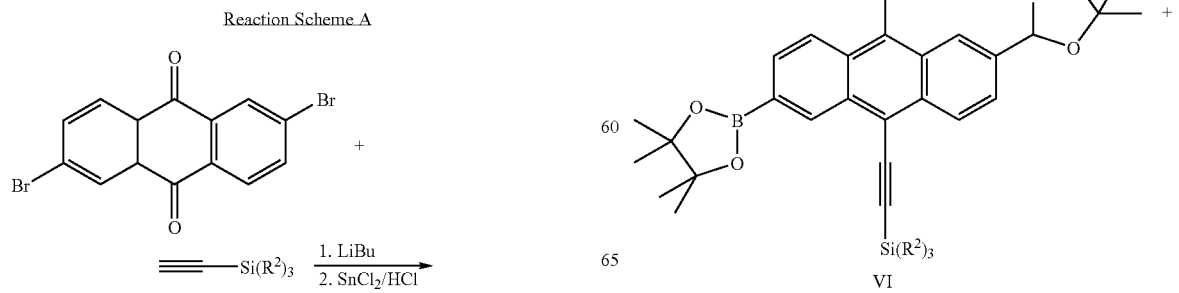

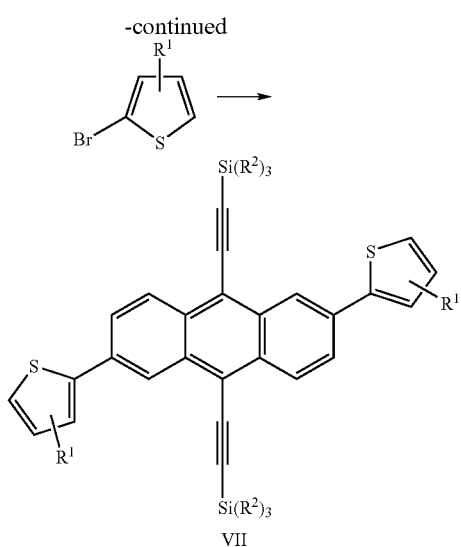

Initially, a silylacetylene compound of formula H—C≡CH—Si(R²)₃ can be treated with butyl lithium to form a lithiated version Li—C≡CH—Si(R²)₃ of the silylacetylene compound. Various silylacetylene compounds are commercially available. For example, (trimethylsilyl)acetylene, (triethylsilyl)acetylene, (triisopropylsilyl)acetylene, and (tert-butyldimethylsilyl)acetylene are available from GFS Chemicals, Columbus, Ohio. (Dimethylphenylsilyl)acetylene, (methyldiphenylsilyl)acetylene, and (triphenylsilyl)acetylene are available from Sigma Aldrich (Milwaukee, Wis.).

The lithiated version of the silylacetylene compound can then be reacted with a 2,6-dihaloanthraquinone such as 2,6-dibromoanthraquinone. The resulting diol intermediate can then be treated with a reducing agent such as stannous chloride to form the 2,6-dihalo-9,10-bis(silylethynyl)anthracene of Formula (V). 2,6-dibromoanthraquinone can be prepared from 2,6-diaminoanthraquinone, which is available from Sigma Aldrich (Milwaukee, Wis.), using the procedure described by Ito et al., *Angew. Chem. Int. Ed.*, 42, 1159-1162 (2003). It can be further recrystallized from N,N-dimethylformamide (DMF).

The 2,6-dihalo-9,10-bis(silylethynyl)anthracene of Formula (V) can then be reacted with a dioxaborolane such as bis(pinacolato)diboron to form a compound of Formula (VI) that has two dioxaborolane groups such as tetramethyldioxaborolane. The compound of Formula (VI) subsequently can be reacted with a halothiophene compound to form the semiconductor compound of Formula (VII). Some halothiophenes are commercially available. For example, 2-bromothiophene, 2-bromo-5-thiophenecarboxaldehyde, 2-bromo-5-acetylthiophene, 2-bromo-3-methylthiophene, 2-bromothiophene-5-sulfonamide, 2-bromo-5-thiophenecarboxylic acid, 2-bromo-5-methylthiophene, and 5-bromo-2,2'-bithiophene are available from Sigma Aldrich (Milwaukee, Wis.). Additional substituted 2-bromothiophenes such as 2-bromo-3-methoxythiophene-4-carbonyl chloride, 2-bromo-3-methoxythiophene-4-carboxylic acid, ethyl 2-(5-bromothien2-yl) glyoxylate, 2-bromo-5-phenylthiophene, and N-methyl-(2-bromothien-3-yl)methylamine are available from Maybridge Chemical Co. Ltd. (Cornwall, UK). The compound 2-bromo-5-(isoxazol-3-yl)thiophene is available from ASDI Incorporated (Newark, Del.) and the compound 5-bromothiophene-3-carbaldehyde is available from UkrOrgSynthesis Ltd. (Kiev, Ukraine). Other substituted 2-bromothiophenes can be prepared using a NBS bromination reaction of the corresponding substituted thiophene. For example, see the reactions described by Vidal et al., *Chem. Eur. J.*, 6, 1663-1673 (2000).

The small molecule semiconductors of Formula (I) are usually thermally stable as characterized using Differential Scanning Calorimetry. The decomposition temperature is often greater than 350° C. Solutions of the small molecule semiconductors of Formula (I) are stable under normal ambient conditions (e.g., normal ambient temperature and humidity) and under typical room lighting conditions for extended periods. For example, no color change was observed in solutions after several weeks of storage under ambient conditions and typical room lighting conditions. The good stability results from the anthracene structure. Anthracene often shows better stability than pentacene because of its shorter conjugation length. The silylethynyl groups substituted at 9,10 positions prevent these molecules from undergoing the Diels-Alder addition reaction with singlet oxygen or with themselves (dimerization reaction).

The coating compositions include an insulating polymer and an organic solvent in addition to the small molecule semiconductor of Formula (I). Any insulating polymer that dissolves in an organic solvent suitable for the small molecule semiconductor can be used in the coating composition. Suitable insulating polymers typically do not have conjugated carbon-carbon double bonds along the backbone of the polymer. That is, the insulating polymers are non-conductive over the length of the polymeric chain. The insulating polymer, however, can have regions with conjugated carbon-carbon double bonds. For example, the insulating polymer can have pendant conjugated aromatic groups. In some embodiments, the insulating polymer is aliphatic and has few, if any, carbon-carbon double bonds.

The insulating polymer is often an amorphous material. Exemplary insulating polymers include, but are not limited to, polystyrene (PS), poly(α-methylstyrene) (PαMS), poly(methyl methacrylate) (PMMA), polyvinylphenol (PVP), poly(vinyl alcohol) (PVA), poly(vinyl acetate) (PVAc), polyvinylchloride (PVC), polyvinyldenfluoride (PVDF), cyanoethylpullulan (CYPEL), poly(divinyltetramethyldisiloxane-bis(benzocyclobutene)) (BCB), and the like.

The insulating polymer can have any suitable molecular weight that can be dissolved in the organic solvent. The molecular weight of the insulating polymer can influence the viscosity of the coating composition. Insulating polymers with a higher molecular weight tend to result in coating compositions with higher viscosity. The desired viscosity may depend, at least in part, on the method used to prepare a coating layer from the coating composition. For example, lower viscosity coating compositions can be used with inkjet methods compared to knife coating methods.

In many embodiments, however, the molecular weight of the insulating polymer is at least 1000 g/mole, at least 2000 g/mole, at least 5000 g/mole, at least 10,000 g/mole, at least 20,000 g/mole, at least 50,000 g/mole, or at least 100,000 g/mole. The molecular weight is often no greater than 1,000,000 g/mole, no greater than 500,000 g/mole, no greater than 200,000 g/mole, or no greater than 100,000 g/mole. The molecular weight is often in the range of 1000 to 1,000,000 g/mole, in the range of 2000 to 500,000 g/mole, or in the range of 2000 to 200,000 g/mole.

The coating composition contains at least 0.1 weight percent dissolved insulating polymer and at least 0.1 weight percent dissolved small molecule semiconductor of Formula (I) based on the total weight of the coating composition. Any organic solvent that can provide this minimum solubility can be used. The organic solvent is often selected based on the particular insulating polymer selected and based on the $R^1$ and $R^2$ groups present on the small molecule semiconductor of Formula (I). In some applications, the organic solvent is selected to have a relatively high boiling point and relatively low toxicity. For example, for some but not all applications, it is desirable to use an organic solvent having a boiling point greater than 80° C., greater than 90° C., or greater than 100° C.

A first suitable type of organic solvent has a single aromatic ring that can be optionally substituted with one or more alkyl groups. That is, the first suitable type of organic solvent can be a benzene that is unsubstituted or substituted with at least one alkyl group. Examples of this first type of organic solvent include, but are not limited to, benzene, toluene, xylene, o-xylene, m-xylene, p-xylene, ethylbenzene, n-propylbenzene, n-butylbenzene, n-pentylbenzene, and n-hexylbenzene. A second suitable type of organic solvent is an alkane that is substituted with one or more halo groups. Examples of this second type of organic solvent include, but are not limited to, chloroform, 1,2-dichloroethane, 1,1,2,2-tetrachloroethane, and trichloroethane. A third suitable type of organic solvent has a single aromatic ring that is substituted with one or more halo groups. That is, the third suitable type of organic solvent can be benzene substituted with at least one halo group. Examples of this third type of organic solvent include, but are not limited to, chlorobenzene and dichlorobenzene. A fourth suitable type of organic solvent is a ketone that is cyclic, linear, branched, or a combination thereof. Examples of this fourth type of organic solvent include, but are not limited to, acetone, methylethylketone, methylisobutylketone, isophorone, 2,4-pentanedione, cyclopentanone, cyclohexanone, 2-methylcyclopentone, 3-methylcyclopentanone, 2,4-dimethylcyclopentanone, and 1,3-cyclohexanone. A fifth suitable type of organic solvent is an ether such as a cyclic ether. Examples of this fifth type of organic solvent include, but are not limited to, 1,4-dioxane and tetrahydrofuran (THF). A sixth suitable type of organic solvent is an amide. Examples of this sixth type of organic solvent include, but are not limited to, N,N-dimethylformamide (DMF) and N,N-dimethylacetamide (DMAc). A seventh suitable type of organic solvent has a single aromatic ring that can be optionally substituted with at least one alkoxy groups. That is, the seventh suitable type of organic solvent can be a benzene that is substituted with at least one alkoxy group. The benzene ring can be optionally further substituted with a halo group. Examples of this seventh type of organic solvent include, but are not limited to, anisole, ethoxybenzene, 2-bromoanisole, 4-bromoanisole, 2-fluoroanisole.

The concentration of small molecule semiconductor in the coating composition is often at least 0.1 weight percent, at least 0.2 weight percent, at least 0.3 weight percent, at least 0.5 weight percent, at least 1.0 weight percent, at least 1.5 weight percent, or at least 2.0 weight percent based on the total weight of the coating composition. The concentration of the small molecule semiconductor is often up to 10 weight percent, up to 5 weight percent, up to 4 weight percent, up to 3 weight percent, or up to 2 weight percent based on the total weight of the coating composition. In many embodiments, at least 50 weight percent, at least 60 weight percent, at least 70 weight percent, at least 80 weight percent, at least 90 weight percent, at least 95 weight percent, at least 98 weight percent, or at least 99 weight percent of the small molecule semiconductor is dissolved in the coating composition. In these embodiments, the coating composition can include both dissolved and dispersed or suspended small molecule semiconductor of Formula (I). In some embodiments, the entire amount of the small molecule semiconductor present in the coating composition is dissolved. That is, in these embodiments, the small molecule semiconductor can be entirely dissolved in the coating composition.

The concentration of the insulating polymer in the coating composition is often at least 0.1 weight percent, at least 0.2 weight percent, at least 0.5 weight percent, at least 1.0 weight percent, at least 1.5 weight percent, at least 2.0 weight percent, at least 2.5 weight percent, at least 3 weight percent, at least 5 weight percent, or at least 10 weight percent based on the total weight of the coating composition. The lower concentration limit can depend on the use of the coating composition. If the coating composition is applied to a surface using an inkjet method, the concentration of the insulating polymer is often at least 0.5 weight percent based on the total weight of the coating composition. Lower concentrations may have an undesirably low viscosity. If the coating composition is applied to a surface using a different technique such as knife coating, however, the viscosity of the coating composition can be lower (i.e., the concentration of the insulating polymer can be less than 0.5 weight percent based on the total weight of the coating composition).

The concentration of the insulating polymer in the coating composition is often up to 20 weight percent, up to 10 weight percent, up to 5 weight percent, up to 4 weight percent, or up to 3 weight percent based on the total weight of the coating composition. If the concentration is too high, the viscosity of the coating composition may be unacceptably high for many applications. Typically, the upper limit is determined by the solubility of the insulating polymer in the coating composition. The insulating polymer is typically dissolved or substantially dissolved rather than dispersed or suspended in the coating composition. As used herein, the term "substantially dissolved" means that the insulating polymer is dissolved but may contain an impurity that is not dissolved in the coating composition. At least 98 weight percent, at least 99 weight percent, at least 99.5 weight percent, at least 99.8 weight percent, or at least 99.9 weight percent of the insulating polymer is dissolved in the coating composition.

Any ratio of the small molecule semiconductor to the insulting polymer can be used in the coating composition. In some applications, the weight ratio of the small molecule to the insulating polymer is in the range of 1:10 to 20:1, in the range of 1:10 to 10:1, in the range of 1:8 to 8:1, in the range of 1:5 to 5:1, in the range of 1:4 to 4:1, in the range of 1:3 to 3:1, or in the range of 1:2 to 2:1.

The percent solids of the coating composition can be any desired amount but is typically in the range of 0.2 to 30 weight percent based on the total weight of the coating composition. The percent solids is often in the range of 0.5 to 20 weight percent, in the range of 0.5 to 10 weight percent, in the range of 0.5 to 5 weight percent, or in the range of 1 to 5 weight percent. In many embodiments, the percent solids is limited by the solubility of the small molecule semiconductor of Formula (I) plus the solubility of the insulating polymer in the organic solvent.

The coating compositions are often used to prepare a semiconductor layer in a semiconductor device. Thus, in another aspect, a semiconductor device is provided that contains a semiconductor layer. The semiconductor layer includes (a) a small molecule semiconductor of Formula (I) and (b) an insulating polymer.

Semiconductor devices have been described, for example, by S. M. Sze in *Physics of Semiconductor Devices*, $2^{nd}$ edition, John Wiley and Sons, New York (1981). These semiconductor devices include rectifiers, transistors (of which there are many types, including p-n-p, n-p-n, and thin-film transistors), photoconductors, current limiters, thermistors, p-n junctions, field-effect diodes, Schottky diodes, and the like. Semiconductor devices can include components such as transistors, arrays of transistors, diodes, capacitors, embedded capacitors, and resistors that are used to form circuits. Semiconductor devices also can include arrays of circuits that perform an electronic function. Examples of these arrays or integrated circuits include inverters, oscillators, shift registers, and logic circuits. Applications of these semiconductor devices and arrays include radio frequency identification devices (RFIDs), smart cards, display backplanes, sensors, memory devices, and the like.

Some of the semiconductor devices are organic thin-film transistors as shown schematically in FIGS. 1 to 6. Any given layer in the various thin film transistors shown in FIGS. 1 to 6 can include multiple layers of materials. Further, any layer can include a single material or multiple materials. Further, as used herein, the terms "disposed", "disposing", "deposited", "depositing", and "adjacent" do not preclude another layer between the mentioned layers. As used herein, these terms mean that a first layer is positioned near a second layer. The first layer often contacts the second layer but another layer could be positioned between the first layer and the second layer.

One embodiment of an organic thin-film transistor 100 is shown schematically in FIG. 1. The organic thin-film transistor (OTFT) 100 includes a gate electrode 14, a gate dielectric layer 16 disposed on the gate electrode 14, a source electrode 22, a drain electrode 24, and a semiconductor layer 20 that is in contact with both the source electrode 22 and the drain electrode 24. The source electrode 22 and the drain electrode 24 are separated from each other (i.e., the source electrode 22 does not contact the drain electrode 24) and are positioned adjacent to the dielectric layer 16. Both the source electrode 22 and the drain electrode 24 are in contact with the semiconducting layer 20 such that a portion of the semiconductor layer is positioned between the source electrode and the drain electrode. The portion of the semiconductor layer that is positioned between the source electrode and the drain electrode is referred to as the channel 21. The channel is adjacent to the gate dielectric layer 16. Some semiconductor devices have an optional surface treatment layer between the gate dielectric layer 16 and the semiconductor layer 20.

An optional substrate can be included in the organic thin-film transistors. For example, the optional substrate 12 can be adjacent to the gate electrode 14 as shown schematically in FIG. 2 for the OTFT 200 or adjacent to the semiconductor layer 20 as shown schematically in FIG. 3 for the OTFT 300. The OTFT 300 can include an optional surface treatment layer between the substrate 12 and the semiconductor layer 20.

Figure 4:
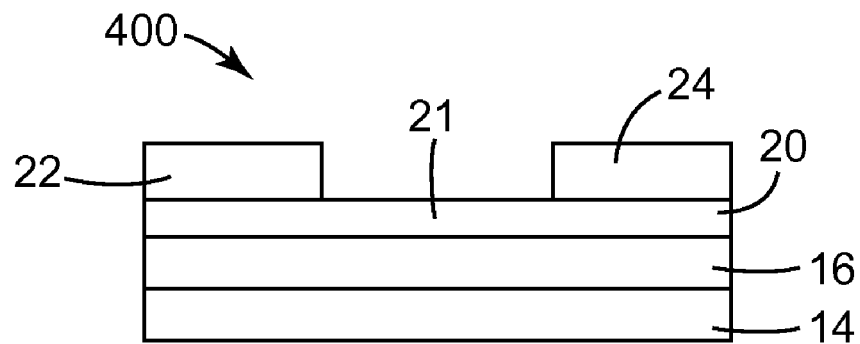
FIG. 4 schematically illustrates a fourth exemplary thin film transistor.

Another embodiment of an organic thin-film transistor is shown schematically in FIG. 4. This organic thin-film transistor 400 includes a gate electrode 14, a gate dielectric layer 16 disposed on the gate electrode 14, a semiconductor layer 20, and a source electrode 22 and a drain electrode 24 disposed on the semiconductor layer 20. In this embodiment, the semiconductor layer 20 is between the gate dielectric layer 16 and both the source electrode 22 and the drain electrode 24. The source electrode 22 and the drain electrode 24 are separated from each other (i.e., the source electrode 22 does not contact the drain electrode 24). Both the source electrode 22 and the drain electrode 24 are in contact with the semiconducting layer such that a portion of the semiconductor layer is positioned between the source electrode and the drain electrode. The channel 21 is the portion of the semiconductor layer that is positioned between the source electrode 22 and the drain electrode 24. One or more optional surface treatment layers can be included in the semiconductor device. For example, an optional surface treatment layer can be included between the gate dielectric layer 16 and the semiconductor layer 20.

An optional substrate can be included in the organic thin-film transistors. For example, the optional substrate 12 can be in contact with the gate electrode 14 as shown schematically in FIG. 5 for the OTFT 500 or in contact with the semiconductor layer 20 as shown schematically in FIG. 6 for the OTFT 600. OTFT 600 can include an optional surface treatment layer between the substrate 12 and the semiconductor layer 20.

In operation of the semiconductor device configurations shown in FIGS. 1 to 6, voltage can be applied to the drain electrode 24. However, at least ideally, no charge (i.e., current) is passed to the source electrode 22 unless voltage is also applied to the gate electrode 14. That is, unless voltage is applied to the gate electrode 14, the channel 21 in the semiconductor layer 20 remains in a non-conductive state. Upon application of voltage to the gate electrode 14, the channel 21 becomes conductive and charge flows through the channel 21 from the source electrode 22 to the drain electrode 24.

A substrate 12 often supports the OTFT during manufacturing, testing, and/or use. Optionally, the substrate can provide an electrical function for the OTFT. For example, the backside of the substrate can provide electrical contact. Useful substrate materials include, but are not limited to, inorganic glasses, ceramic materials, polymeric materials, filled polymeric materials (e.g., fiber-reinforced polymeric materials), metals, paper, woven or non-woven cloth, coated or uncoated metallic foils, or a combination thereof.

The gate electrode 14 can include one or more layers of a conductive material. For example, the gate electrode can include a doped silicon material, a metal, an alloy, a conductive polymer, or a combination thereof. Suitable metals and alloys include, but are not limited to, aluminum, chromium, gold, silver, nickel, palladium, platinum, tantalum, titanium, indium tin oxide (ITO), fluorine tin oxide (FTO), antimony doped tin oxide (ATO), or a combination thereof. Exemplary conductive polymers include, but are not limited to, polyaniline, poly(3,4-ethylenedioxythiophene)/poly(styrene sulfonate), or polypyrrole. In some organic thin film transistors, the same material can provide both the gate electrode function and the support function of the substrate. For example, doped silicon can function as both the gate electrode and as the substrate.

The gate electrode in some embodiments is formed by coating a substrate surface with a dispersion that contains conductive materials such as nanoparticles that are conductive or polymeric materials that are conductive. Conductive nanoparticles include, but are not limited to, ITO nanoparticles, ATO nanoparticles, silver nanoparticles, gold nanoparticles, or carbon nanotubes.

The gate dielectric layer 16 is disposed on the gate electrode 14. This gate dielectric layer 16 electrically insulates the gate electrode 14 from the balance of the OTFT device. Useful materials for the gate dielectric include, for example, an inorganic dielectric material, a polymeric dielectric material, or a combination thereof. The gate dielectric can be a single layer or multiple layers of suitable dielectric materials. Each layer in a single or multilayer dielectric can include one or more dielectric materials.

The organic thin film transistors can include an optional surface treatment layer disposed between the gate dielectric layer 16 and at least a portion of the organic semiconductor layer 20 or disposed between the substrate 12 and at least a portion of the organic semiconductor layer 20. In some embodiments, the optional surface treatment layer serves as an interface between the gate dielectric layer and the semiconductor layer or between the substrate and the semiconductor layer. The surface treatment layer can be a self-assembled monolayer as described in U.S. Pat. No. 6,433,359 B1 (Kelley et al.) or a polymeric material as described in U.S. Pat. No. 6,946,676 (Kelley et al.), and U.S. Pat. No. 6,617,609 (Kelley et al.).

The source electrode 22 and drain electrode 24 can be metals, alloys, metallic compounds, conductive metal oxides, conductive ceramics, conductive dispersions, and conductive polymers, including, for example, gold, silver, nickel, chromium, barium, platinum, palladium, aluminum, calcium, titanium, indium tin oxide (ITO), fluorine tin oxide (FTO), antimony tin oxide (ATO), indium zinc oxide (IZO), poly(3,4-ethylenedioxythiophene)/poly(styrene sulfonate), polyaniline, other conducting polymers, alloys thereof, combinations thereof, and multiple layers thereof. Some of these materials are appropriate for use with n-type semiconductor materials and others are appropriate for use with p-type semiconductor materials, as is known in the art.

The thin film electrodes (e.g., the gate electrode, the source electrode, and the drain electrode) can be provided by any means known in the art such as physical vapor deposition (for example, thermal evaporation or sputtering), ink jet printing, or the like. The patterning of these electrodes can be accomplished by known methods such as shadow masking, additive photolithography, subtractive photolithography, printing, microcontact printing, and pattern coating.

In yet another aspect, a method of making a semiconductor device is provided. The method includes providing a semiconductor layer that contains (a) a small molecule semiconductor of Formula (I) and (b) an insulating polymer. Although any suitable method can be used to provide the semiconductor layer, this layer is often provided using a coating composition. The coating composition can be the same as described above.

In some exemplary methods of preparing a semiconductor device, the method involves providing a first layer selected from a dielectric layer or a conductive layer and disposing a semiconductor layer adjacent to the first layer. No specific order of preparing or providing is necessary; however, the semiconductor layer is often prepared on the surface of another layer such as the dielectric layer, the conductive layer, or a substrate. The conductive layer can include, for example, one or more electrodes such as a gate electrode or a layer that includes both the source electrode and the drain electrode. The step of disposing a semiconductor layer adjacent to the first layer includes often includes (1) preparing a coating composition that includes the small molecule semiconductor of Formula (I), the insulating polymer, and an organic solvent that dissolves at least a portion of both the small molecule semiconductor and the insulating polymer, (2) applying the coating composition to the first layer to form a coating layer, and (3) removing at least a portion of the organic solvent from the coating layer. The coating composition contains at least 0.1 weight percent dissolved small molecule semiconductor and at least 0.1 weight percent dissolved insulating polymer based on the total weight of the coating composition.

Some of the methods of preparing semiconductor devices are methods of preparing organic thin film transistors. One method of preparing an organic thin film transistor involves arranging multiple layers in the following order: a gate electrode; a gate dielectric layer; a layer having a source electrode and a drain electrode that are separated from each other; and a semiconductor layer in contact with both the source electrode and the drain electrode. The semiconductor layer includes an insulating polymer and a small molecule semiconductor of Formula (I). Exemplary organic thin film transistors according to this method are shown schematically in FIGS. 1 to 3.

For example, the organic thin film transistor shown schematically in FIG. 1 can be prepared by providing a gate electrode 14; depositing a gate dielectric layer 16 adjacent to the gate electrode 14; positioning a source electrode 22 and a drain electrode 24 adjacent to the gate dielectric layer 16 such that the source electrode 22 and the drain electrode 24 are separated from each other; and forming a semiconductor layer 20 that is deposited on the source electrode 22, on the drain electrode 24, and in the area 21 between the source electrode 22 and the drain electrode 24. The semiconductor layer 20 contacts both the source electrode 22 and the drain electrode 24. The portion of the semiconductor layer that is positioned in the area between the source electrode and the drain electrode defines a channel.

Figure 2:
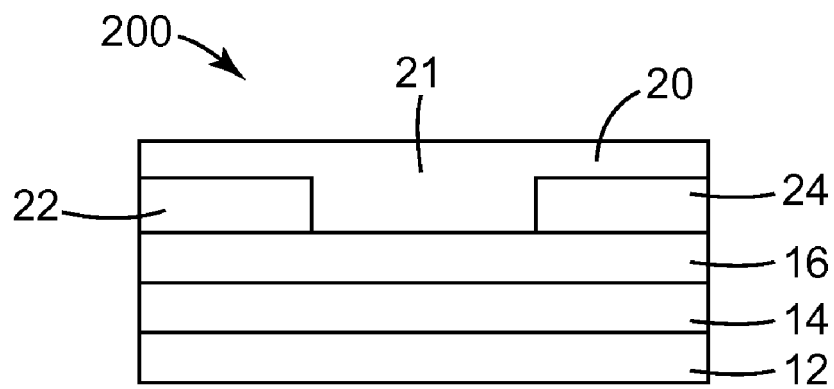
FIG. 2 schematically illustrates a second exemplary thin film transistor.

The organic thin film transistor shown schematically in FIG. 2 can be prepared by providing a substrate 12; depositing a gate electrode 14 on the substrate 12; depositing a gate dielectric layer 16 adjacent to the gate electrode 14 such that the gate electrode 14 is positioned between the substrate 12 and the gate dielectric layer 16; positioning a source electrode 22 and a drain electrode 24 adjacent to the gate dielectric layer 16 such that the two electrodes are separated from each other; and forming a semiconductor layer 20 adjacent to the source electrode 22, the drain electrode 24, and in the area 21 between the source electrode 22 and the drain electrode 24. The semiconductor layer 20 contacts both the source electrode 22 and the drain electrode 24. The portion of the semiconductor layer that is positioned in the area between the source electrode and the drain electrode defines a channel.

Figure 3:
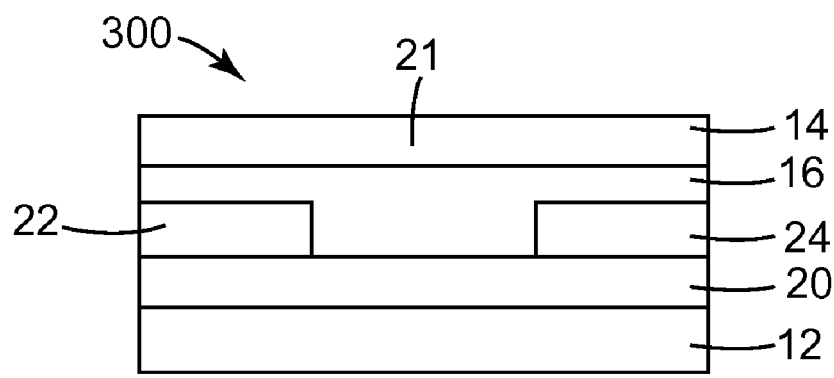
FIG. 3 schematically illustrates a third exemplary thin film transistor.

The organic thin film transistor shown schematically in FIG. 3 can be prepared by providing a substrate 12; forming a semiconductor layer 20 adjacent to the substrate 12; positioning a source electrode 22 and a drain electrode 24 adjacent to the semiconductor layer 20 opposite the substrate 12 such that the source electrode 22 and drain electrodes 24 are separated from each other; depositing a gate dielectric layer 16 adjacent to the source electrode 22, the drain electrode 24, and a portion of the semiconducting layer 20 between the source electrode 22 and the drain electrode 24; and depositing a gate electrode 14 adjacent to the gate dielectric layer 16. Both the source electrode 22 and the drain electrode 24 contact the semiconductor layer 20. A portion of the semiconductor layer is positioned between the source electrode 22 and the drain electrode 24. This portion of the semiconductor layer defines a channel.

The organic thin film transistors shown schematically in FIGS. 4 to 6 can be prepared by a method that involves arranging multiple layers in the following order: a gate electrode; a gate dielectric layer; a semiconductor layer containing the insulating polymer and the semiconductor of Formula (I); and a layer having a source electrode and a drain electrode that are separated from each other, wherein the semiconductor layer contacts both the drain electrode and the source electrode. In some embodiments, a surface treatment layer can be positioned between the gate dielectric layer and the semiconductor layer. A substrate can be positioned adjacent to the gate electrode or adjacent to the layer containing the source electrode and the drain electrode.

For example, the organic thin film transistor shown schematically in FIG. 4 can be prepared by providing a gate electrode 14; depositing a gate dielectric layer 16 adjacent to the gate electrode 14; forming a semiconductor layer 20 adjacent to the gate dielectric layer 16 (i.e., the gate dielectric layer 16 is positioned between the gate electrode 14 and the semiconducting layer 20); and positioning a source electrode 22 and a drain electrode 24 adjacent to the semiconductor layer 20. The source electrode 22 and the drain electrode 24 are separated from each other and both electrodes are in contact with the semiconductor layer 20. A portion of the semiconductor layer is positioned between the source and drain electrodes.

Figure 5:
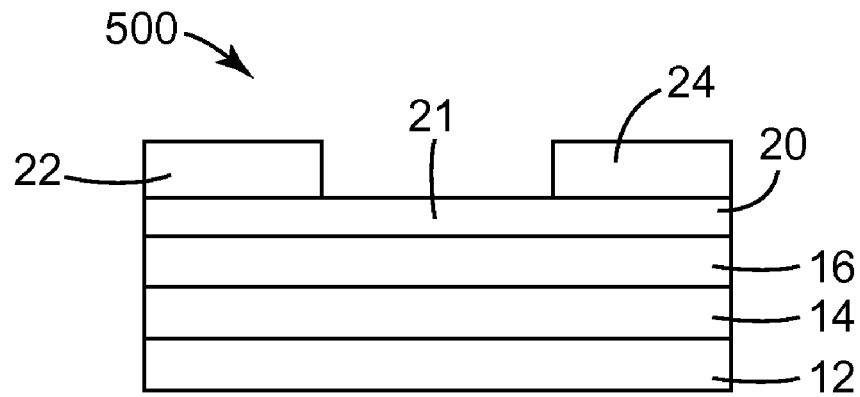
FIG. 5 schematically illustrates a fifth exemplary thin film transistor.

The organic thin film transistor shown schematically in FIG. 5 can be prepared by providing a substrate 12, depositing a gate electrode 14 adjacent to the substrate 12, depositing a gate dielectric layer 16 adjacent to the gate electrode 14 such that the gate electrode 14 is positioned between the substrate 12 and the gate dielectric layer 16; forming a semiconductor layer 20 adjacent to the gate dielectric layer 16; and positioning a source electrode 22 and a drain electrode 24 adjacent to the semiconductor layer 20. The source electrode 22 and the drain electrode 24 are separated from each other and both electrodes are in contact with the semiconductor layer 20. A portion of the semiconductor layer 20 is positioned between the source electrode 22 and the drain electrode 24.

Figure 6:
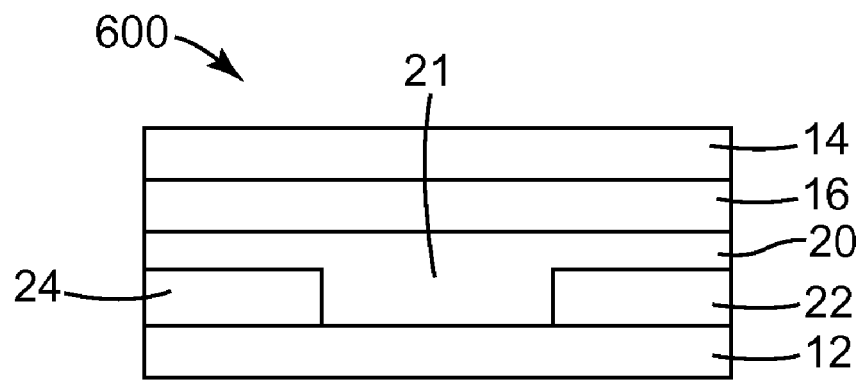
FIG. 6 schematically illustrates a sixth exemplary thin film transistor.

The organic thin film transistor shown schematically in FIG. 6 can be prepared by providing a substrate 12; positioning a source electrode 22 and a drain electrode 24 adjacent to the substrate such that the source electrode 22 and the drain electrode 24 are separated from each other; forming a semiconductor layer 20 that contacts the source electrode 22 and the drain electrode 24; and depositing a gate dielectric layer 16 adjacent to the semiconductor layer opposite the source electrode 22 and the drain electrode 24; and depositing a gate electrode 14 adjacent to the gate dielectric layer 16. A portion of the semiconductor layer 20 is positioned between the source electrode 22 and the drain electrode 24.

In any of the organic thin film transistors shown schematically in FIGS. 1 to 6, the semiconductor layer can be formed by (1) preparing a coating composition that contains the small molecule semiconductor of Formula (I), the insulating polymer, and an organic solvent that dissolves at least a portion of both the small molecule semiconductor and the insulating polymer, (2) applying the coating composition to another layer of the organic thin film transistor, and (3) removing at least a portion of the organic solvent. The coating composition contains at least 0.1 weight percent dissolved small molecule semiconductor and at least 0.1 weight percent dissolved insulating polymer based on the total weight of the coating composition.

EXAMPLES

All reagents were purchased from commercial sources and used without further purification unless otherwise noted.

2,6-Diaminoanthraquinone, sodium carbonate, tin (II) chloride, bis(pinacolato)diboron, tetrakis(triphenylphosphine)palladium(0), 2-bromothiophene, 5-bromo-2,2'-bithiophene, and N-bromosuccinimide (NBS) were purchased from Sigma Aldrich (Milwaukee, Wis.). The NBS was further recrystallized from acetic acid before use.

ALIQUAT 336 (a phase transfer catalyst), n-butyl lithium, [1,1'-bis(diphenylphosphino)ferrocene]dichloropalladium complex with dichloromethane, 2-bromo-3-methylthiophene, 2-bromo-5-methylthiophene, 2-ethylthiophene, 2-propylthiophene, 2-hexylthiophene, 3-hexylthiophene, and 1,1,1,3,3,3-hexamethyldisilanzane (HMDS) were obtained from Alfa Aesar (Ward Hill, Mass.).

Triisopropylsilylacetylene was purchased from GFS Chemicals (Columbus, Ohio).

n-Butylbenzene was from TCI America (Portland, Oreg.).

5-Bromothiophene-2-carboxaldehyde was from Maybridge Chemical Company Ltd. (Cornwall, UK).

Hexane and tetrahydrofuran (THF) were distilled over sodium.

2,6-Dibromoanthraquinone was prepared from commercially available 2,6-diaminoanthraquinone (Sigma Aldrich) as described by Ito et al., *Angew. Chem. Int. Ed.*, 42, 1159-1162 (2003). After sublimation, it was further purified by recrystallization from dimethylformamide (DMF).

Substituted 2-bromothiophenes are either commercially available or were prepared through a NBS bromination reaction of the respondent substituted thiophene. For a similar reaction, see Vidal et al., *Chem. Eur. J.*, 6, 1663-1673 (2000).

The molecular structures of all products and intermediates were confirmed by $^1$H-NMR (400 MHz).

The precursor 2,6-bis-(4,4,5,5-tetramethyl-1,3,2-dioxaborolan-2-yl)-9,10-bis-[(triisopropylsilyl)ethynyl]anthracene was synthesized according to Reaction Scheme 1, as described in Preparatory Examples 1 and 2.

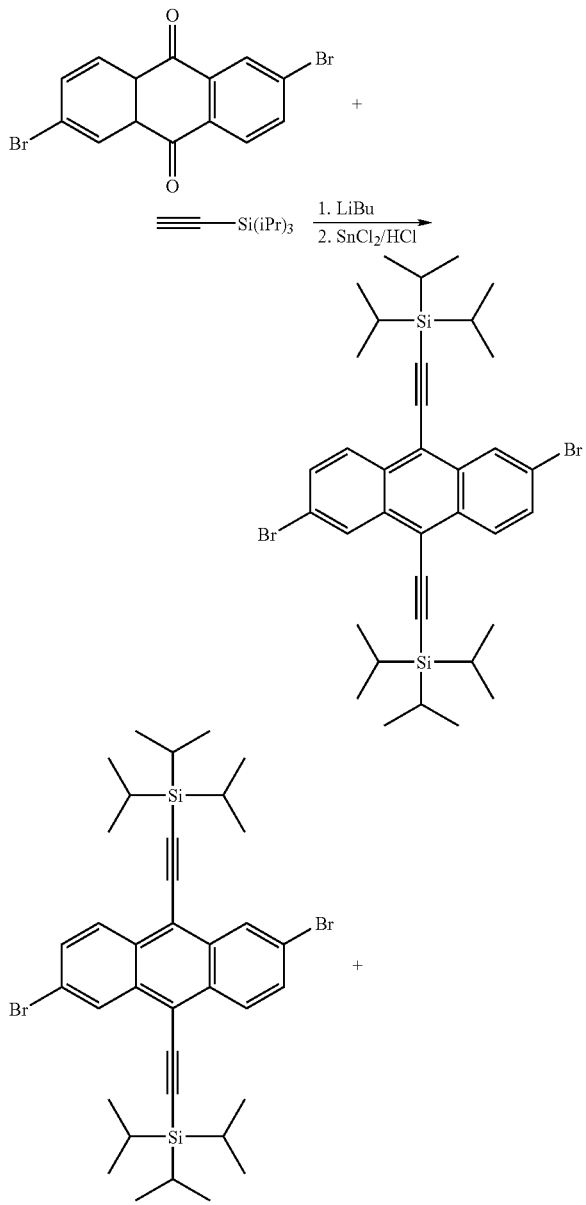

Reaction Scheme 1

-continued

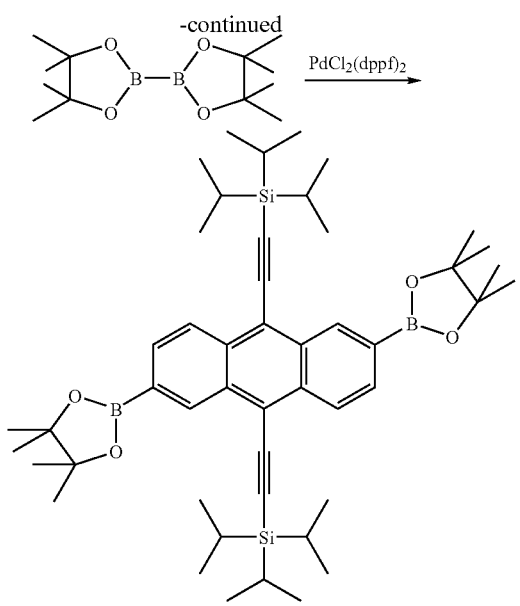

Preparatory Example 1

Synthesis of 2,6-dibromo-9,10-bis[(triisopropylsilyl)-ethynyl]anthracene

Triisopropylsilylacetylene (12.32 grams, 67.5 mmol) and dry hexane (140 mL) were added under a dry nitrogen blanket to an oven-dried round bottom flask (1 L). Butyl lithium (2.7 M in hexane, 14.5 mL, 39.2 mmol) was added dropwise under dry nitrogen through a syringe to the mixture. After addition, the mixture was stirred at room temperature for 2 hours. This colorless solution, was then added to a suspension of 2,6-dibromoanthraquinone (5.49 grams, 15.0 mmol) in dry THF (300 mL) under dry nitrogen. The solution turned red immediately and the 2,6-dibromoanthraquininone dissolved in minutes. The mixture was stirred at room temperature overnight and the solution became dark red. When deionized (DI) water (6.0 mL) was added, the color changed to light red, and a white precipitate appeared. Tin (II) chloride (8.088 grams, 42.6 mmol) in hydrochloric acid (HCl) (18 mL, 10 weight percent) aqueous solution was then added. The mixture was heated to 60° C. for 2 hours and then cooled to room temperature. The organic solvent was removed by rotary evaporation. Deionized (DI) water (100 mL) was added and the resulting mixture was then extracted with hexane (100 mL×3). The hexane solution was washed with DI water until neutral. The washed hexane solution was concentrated and purified by column chromatography (silica gel/hexane). A bright yellow solid (8.55 grams, yield: 82%) was obtained as the product.

Preparatory Example 2

Synthesis of 2,6-bis-(4,4,5,5-tetramethyl-1,3,2-dioxaborolan-2-yl)-9,10-bis[(triisopropylsilyl)ethynyl]anthracene 2,6-dibromo-9,10-bis-[(triisopropylsilyl)ethynyl]anthracene (5.225 grams, 7.5 mmol) from Preparatory Example 1, bis(pinacolato)diboron (4.763 grams, 18.8 mmol), potassium acetate (2.940 grams, 30.0 mmol), and chloroform (CHCl$_3$) (100 mL) were charged to a 250 mL flask under dry nitrogen. A yellow solution with suspended KOAc was obtained. The suspension was degassed to remove traces of oxygen. [1,1'-bis(diphenylphosphino)ferrocene]dichloropalladium (0.205 grams) was then added under dry nitrogen. The solution turned orange. The mixture was refluxed at 70° C. for 3 days and then cooled to room temperature. It was washed with DI water (100 mL×3) and dried over magnesium sulfate (MgSO$_4$). The organic solvent was removed by rotary evaporation. The solid residue was purified by column chromatography (silica gel, CHCl$_3$) and recrystallized from ethyl acetate. Orange needle crystals were obtained (3.20 grams, yield: 55%) as the product.

A Suzuki coupling reaction was used to synthesize the substituted acene-thiophene derivatives (Table 1) of Examples 1-9, as shown in Reaction Scheme 2.

Reaction Scheme 2. Syntheses of Acene-thiophene Derivatives

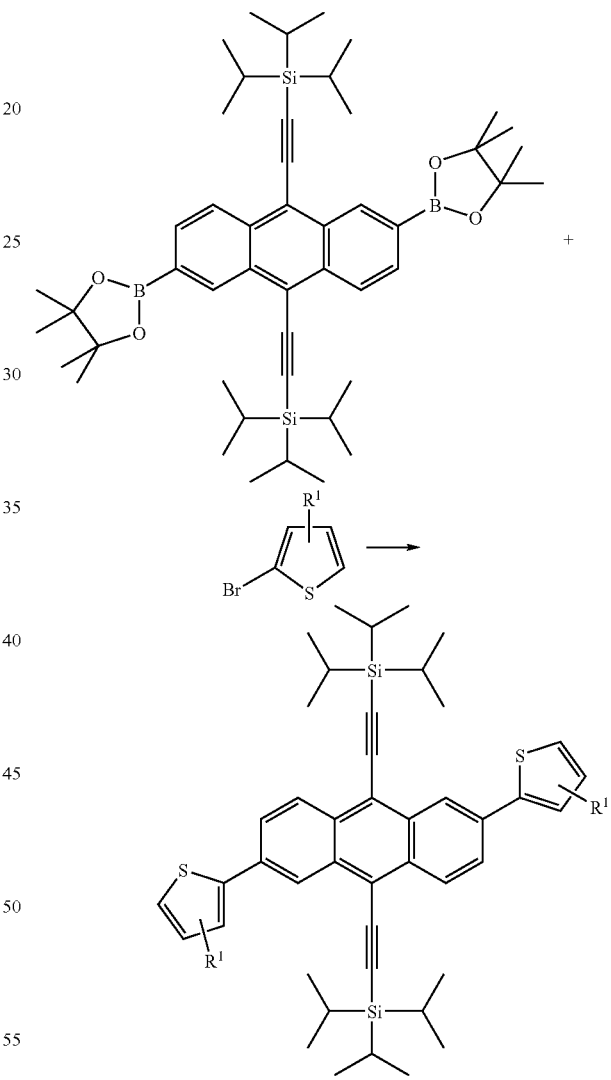

The following general procedure was used in this reaction. A 250 mL Schlenk flask was charged with 2,6-bis-(4,4,5,5-tetramethyl-1,3,2-dioxaborolan-2-yl)-9,10-bis-[(triisopropylsilyl)ethynyl]anthracene (2.00 mmol) of Preparatory Example 2, 2-bromothiophenes (5.00 mmol), sodium carbonate (10 mmol), ALIQUAT 336 (0.09 grams, a mixture of $[CH_3(CH_2)_9]_3NCH_3{}^+Cl^-$ and $[CH_3(CH_2)_7]_3NCH_3{}^+Cl^-$, used as a phase transfer catalyst), distilled water (25 mL), and toluene (100 mL). The mixture was degassed under a Schlenk line to remove oxygen. Tetrakis(triphenylphosphine)palladium(0) (0.02 mmol) was then added under nitrogen flow. The mixture was stirred under nitrogen at 90° C. for 20 hours. The upper toluene solution was isolated and washed with DI water (100 mL×3). After being concentrated to about 25 mL, it was quenched in methanol (MeOH) (100 mL). The precipitate was collected by filtration and was purified by zone sublimation or column chromatography (silica gel, chloroform or hexane). The solid was further purified by recrystallization from ethyl acetate or toluene. $^1$H-NMR (400 MHz, CDCl$_3$) was used to confirm the structures of all these compounds.

Solubility Measurement

The solubility of the small molecule semiconductor was measured in n-butylbenzene at room temperature. The results are summarized in Table 1. The weight percent is based on the total solution weight. Typically, the solubility is lower in n-butylbenzene compared to halogenated solvents such as chloroform, chlorobenzene, and dichlorobenzene.

Differential Scanning Calorimetry Measurement

Differential Scanning Calorimeter (DSC, TA Instruments 2920 from TA Instruments of New Castle, Del.) was used to measure phase transition and melting point of the small molecule semiconductors. Examples 1 to 8 were heated from 30 to 350° C. at a heating rate of 10° C. per minute. All these compounds showed good thermal stability at temperatures up to 350° C. No decomposition was observed up to the 350° C. of the testing range. A liquid crystal phase transition was observed for Example 1 at 176.5° C. and for Example 2 at 114.3° C. Example 9 was heated from 30 to 360° C. at a heating rate of 10° C. per minute. A liquid crystal phase transition was observed for this example at 108.4° C. Example 9 started to decompose around 357° C. The melting points for Examples 1 to 9 are summarized in Table 1.

TABLE 1

Summary of synthesized acene-thiophen derivatives and their properties

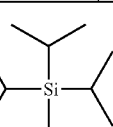

| Example | Small molecule semiconductor | Thienyl group | Solubility in butyl benzene (wt %) | M.P. (° C.) |
|---|---|---|---|---|
| 1 | BT-TIPS-An | *-thienyl | 0.05 | 293.0 |

TABLE 1-continued

Summary of synthesized acene-thiophen derivatives and their properties

| Example | Small molecule semiconductor | Thienyl group | Solubility in butyl benzene (wt %) | M.P. (° C.) |
|---|---|---|---|---|
| 2 | B5MT-TIPS-An | *-thienyl-Me | 0.05 | 333.0 |
| 3 | B3MT-TIPS-An | *-thienyl-Me | 2.3 | 237.6 |
| 4 | B5ET-TIPS-An | *-thienyl-$C_2H_5$ | 1.4 | 274.6 |
| 5 | B5PT-TIPS-An | *-thienyl-$n\text{-}C_3H_7$ | 1.4 | 208.3 |
| 6 | B5HT-TIPS-An | *-thienyl-$n\text{-}C_6H_{13}$ | 2.5 | 190.3 |
| 7 | B3HT-TIPS-An | *-thienyl-$n\text{-}C_6H_{13}$ | 4.2 | 141.8 |
| 8 | B5TT-TIPS-An | *-bithienyl | 0.2 | 299.0 |
| 9 | B5FT-TIPS-An | *-thienyl-CHO | 0.04 | >350 |

Example 1

Synthesis of BT-TIPS-An (2,6-Bis(thiophene-2-yl)-9,10-bis-[(triisopropylsilyl)ethynyl]anthracene)

The crude product (yield: 99%) from precipitation was further purified by zone sublimation under vacuum ($1.2 \times 10^{-6}$ Torr). The source zone temperature was set at 280° C. and the middle zone was at 240° C. Orange product was collected in the middle zone.

Example 2

Synthesis of B5MT-TIPS-An (2,6-Bis(5-methyl-thiophene-2-yl)-9,10-bis-[(triisopropylsilyl)ethynyl]anthracene)

The red/orange crude product (yield: 99%) from precipitation was further purified by zone sublimation. The vacuum was $1.0 \times 10^{-6}$ Torr, the source zone temperature was 250° C., and the middle zone temperature was 200° C. Red needle like crystals in the middle zone were obtained as product.

Example 3

Synthesis of B3MT-TIPS-An (2,6-Bis(3-methyl-thiophene-2-yl)-9,10-bis-[(triisopropylsilyl)ethynyl]anthracene)

The crude product (yield: 99%) from precipitation was further purified by column chromatography (silica gel, hexane) and recrystallized from ethyl acetate. Orange crystals were obtained as product.

Example 4

Synthesis of B5ET-TIPS-An (2,6-Bis(5-ethyl-thiophene-2-yl)-9,10-bis-[(triisopropylsilyl)ethynyl]anthracene)

The bright red/orange crude product (yield: about 100%) collected from precipitation was further purified by column chromatography (silica gel, $CHCl_3$) and was then recrystallized from ethyl acetate. Red crystal was obtained as product.

Example 5

Synthesis of B5PT-TIPS-An (2,6-Bis(5-propyl-thiophene-2-yl)-9,10-bis-[(triisopropylsilyl)ethynyl]anthracene)

The bright orange solid (yield: 98%) collected from precipitation was further purified by column chromatography (silica gel, $CHCl_3$) and was then recrystallized from ethyl acetate. Orange crystals were obtained as product.

Example 6

Synthesis of B5HT-TIPS-An (2,6-Bis(5-hexyl-thiophene-2-yl)-9,10-bis-[(triisopropylsilyl)ethynyl]anthracene)

The bright orange crude product (yield: 99%) collected from precipitation was further purified by column chromatography (silica gel, $CHCl_3$) and was then recrystallized from ethyl acetate. Orange crystals were obtained as product.

Example 7

Synthesis of B3HT-TIPS-An (2,6-Bis(3-hexyl-thiophene-2-yl)-9,10-bis-[(triisopropylsilyl)ethynyl]anthracene)

The bright orange solid (yield: 98%) collected from precipitation was further purified by column chromatography (silica gel, $CHCl_3$) and then recrystallized from ethyl acetate. Orange crystals were obtained as product.

Example 8

Synthesis of B5TT-TIPS-An (2,6-Bis(2,2'-bithiophene-5-yl)-9,10-bis-[(triisopropylsilyl)ethynyl]anthracene)

The bright red solid (yield: 92%) collected from precipitation was further purified by column chromatography (silica gel, $CHCl_3$) and then recrystallized from toluene. Red crystals were obtained as product.

Example 9

Synthesis of B5FT-TIPS-An (2,6-Bis(5-formyl-thiophene-2-yl)-9,10-bis-[(triisopropylsilyl)ethynyl]anthracene)

The bright orange solid (yield: 92%) collected from precipitation was further purified by column chromatography (silica gel, $CHCl_3$) and then recrystallized from ethyl acetate/chloroform (1:1). Orange needle-like crystals were obtained as product.

Example 10

Synthesis of 2,6-Bis(4-formyl-thiophene-2-yl)-9,10-bis[(triisopropylsilyl)ethynyl]anthracene A 250 mL Schlenk flask is charged with 2,6-bis-(4,4,5,5-tetramethyl-1,3,2-dioxaborolan-2-yl)-9,10-bis-[(triisopropylsilyl)ethynyl]anthracene (2.00 mmol), 5-bromothiophene-3-carbaldehyde (UkrOrgSynthesis Ltd., Kiev, Ukraine) (5.00 mmol), sodium carbonate (10 mmol), ALIQUAT 336 (0.09 g, a mixture of $[CH_3(CH_2)_9]_3NCH_3{}^+Cl^-$ and $[CH_3(CH_2)_7]_3NCH_3{}^+Cl^-$, used as a phase transfer catalyst), distilled water (25 mL), and toluene (100 mL). The mixture is degassed under a Schlenk line to remove oxygen. Tetrakis (triphenylphosphine)palladium(0) (0.02 mmol) is then added under nitrogen flow. The mixture is stirred under nitrogen at 90° C. for 20 hours. The upper toluene solution is isolated and washed with DI water (100 mL×3). After being concentrated to about 25 mL, it is quenched in methanol (MeOH) (100 mL). The precipitate is collected by filtration and is purified by zone sublimation or column chromatography (silica gel, chloroform or hexane).

Organic Thin Film Transistor (OTFT) Device Preparation and Characterization

The following general procedure was used for preparing HMDS-treated Si wafers. Heavily doped $n^+$ Si wafers (Si 100, obtained from Silicon Valley Microelectronics, Inc., Santa Clara, Calif.) were sonicated in acetone and isopropanol 10 minutes respectively. The wafers were then rinsed with DI water. After being dried under $N_2$ flow, 1,1,1,3,3,3-hexamethyldisilazane (HMDS) was spin-coated on top at 1000 rpm for 30 seconds. The substrates were stored under $N_2$ before use.

The following general procedure was used for fabricating OTFT devices. The synthesized small molecule semiconductors such as BT-TIPS-An or the like and an insulating polymer such as polystyrene (PS) (Mw=97400, from Sigma Aldrich, Milwaukee, Wis.) were dissolved in n-butylbenzene at room temperature or elevated temperature (such as 90° C.). The solution was then knife coated on the HMDS-treated silicon wafers. After air-drying, gold source/drain electrodes (60 nm thick) were patterned through a polymer shadow mask using a thermal evaporation method.

Thin film transistors were characterized under ambient conditions using a Hewlett Packard Semiconductor Parameter Analyzer (Model 4145A, available from Hewlett Packard Corporation, Palo Alto, Calif.) by sweeping the gate voltage ($V_g$) from +10 V to −40 V, while keeping the drain voltage ($V_{ds}$) at −40 V. A linear fit to the $I_d^{1/2}$–$V_g$ trace permitted the extraction of the saturation mobility and the threshold voltage ($V_t$). A linear fit to the $I_d$–$V_g$ trace allowed the current on/off ratio to be calculated. Hole mobility and the On/Off ratio were summarized in Table 2.

Example 11

OTFT of BT-TIPS-An

BT-TIPS-An and polystyrene were mixed in n-butylbenzene so their weight concentrations were 0.4 weight percent and 2.0 weight percent respectively based on the total weight of the composition. The composition was heated to 90° C. so the solids dissolved completely. The resulting solution was then knife coated on a HMDS-treated substrate, which was at room temperature. After being dried in air, gold top electrodes were patterned through a shadow mask using thermal evaporation method under a vacuum of $2\times10^{-6}$ Torr. The hole mobility μ was calculated to be 0.22 cm$^2$/Vs and the On/Off ratio was $2\times10^5$.

Example 12

OTFT of B5MT-TIPS-An

B5MT-TIPS-An and polystyrene were mixed in n-butylbenzene so their weight concentrations were 0.6 weight percent and 2.0 weight percent respectively based on the total weight of the composition. The composition was heated to 90° C. so the solids dissolved completely. The resulting solution was then knife coated on a HMDS-treated substrate, which was held at 50° C. After being dried in air, gold top electrodes were patterned through a shadow mask using thermal evaporation method under a vacuum of $2\times10^{-6}$ Torr. The hole mobility μ was calculated to be 0.12 cm$^2$/Vs and the On/Off ratio was $1\times10^4$.

Example 13

OTFT of B5ET-TIPS-An

B5ET-TIPS-An and polystyrene were dissolved in n-butylbenzene at room temperature so their weight concentrations were 1.0 weight percent and 2.5 weight percent respectively based on the total weight of the composition. The resulting solution was then knife coated on a HMDS-treated substrate at room temperature. After being dried in air, gold top electrodes were patterned through a shadow mask using thermal evaporation method under a vacuum of $2\times10^{-6}$ Torr. The hole mobility μ was calculated to be 0.003 cm$^2$/Vs and the On/Off ratio was $2\times10^3$.

Example 14

OTFT of B5PT-TIPS-An

B5PT-TIPS-An and polystyrene were dissolved in n-butylbenzene at room temperature so their weight concentrations were 2.5 weight percent and 2.5 weight percent respectively based on the total weight of the composition. The resulting solution was then knife coated on a HMDS-treated substrate at room temperature. After being dried in air, gold top electrodes were patterned through a shadow mask using thermal evaporation method under a vacuum of $2\times10^{-6}$ Torr. The hole mobility μ was calculated to be $1.8\times10^{-3}$ cm$^2$/Vs and the On/Off ratio was $1\times10^3$.

Example 15

OTFT of B5HT-TIPS-An

B5HT-TIPS-An and polystyrene were dissolved in n-butylbenzene at room temperature so their weight concentrations were 1.5 weight percent and 2.5 weight percent respectively based on the total weight of the composition. The resulting solution was then knife coated on a HMDS-treated substrate at room temperature. After being dried in air, gold top electrodes were patterned through a shadow mask using thermal evaporation method under a vacuum of $2\times10^{-6}$ Torr. The hole mobility μ was calculated to be 0.013 cm$^2$/Vs and the On/Off ratio was $3\times10^3$.

Example 16

OTFT of B5TT-TIPS-An

B5TT-TIPS-An and polystyrene were mixed in n-butylbenzene so their weight concentrations were 0.8 weight percent and 2.0 weight percent respectively based on the total weight of the composition. The composition was heated to 90° C. so the solids dissolved completely. The resulting solution was then knife coated on a HMDS-treated substrate, which was held at 50° C. After being dried in air, gold top electrodes were patterned through a shadow mask using thermal evaporation method under a vacuum of $2\times10^{-6}$ Torr. The hole mobility μ was calculated to be 0.07 cm$^2$/Vs and the On/Off ratio was $5\times10^3$.

Example 17

OTFT of B5FT-TIPS-An

B5FT-TIPS-An and polystyrene were dissolved in n-butylbenzene at 90° C. so their weight concentrations were 0.7 weight percent and 2.0 weight percent respectively based on the total weight of the composition. The resulting solution was then knife coated on a HMDS-treated substrate at room temperature. After being dried in air, gold top electrodes were patterned through a shadow mask using thermal evaporation method under a vacuum of $2\times10^{-6}$ Torr. The device was further annealed under nitrogen at 115° C. for 15 minutes. The hole mobility μ was calculated to be 0.01 cm$^2$/Vs and the On/Off ratio was $1\times10^2$.

TABLE 2

OTFT properties of synthesized acene-thiophene derivatives

| Example | Semiconductor (SC) | Thienyl group | Coating composition (wt %) SC/PS/BB* | Mobility (cm$^2$/V·s) | On/Off |
|---|---|---|---|---|---|
| 11 | BT-TIPS-An | *—thienyl | 0.4/2.0/97.6 | 0.22 | 2 × 10$^5$ |
| 12 | B5MT-TIPS-An | *—thienyl—Me | 0.6/2.0/97.4 | 0.12 | 1 × 10$^4$ |
| 13 | B5ET-TIPS-An | *—thienyl—C$_2$H$_5$ | 1.0/2.5/96.5 | 0.003 | 2 × 10$^3$ |
| 14 | B5PT-TIPS-An | *—thienyl—n-C$_3$H$_7$ | 2.5/2.5/95.0 | 0.0018 | 1 × 10$^3$ |
| 15 | B5HT-TIPS-An | *—thienyl—n-C$_6$H$_{13}$ | 1.5/2.5/96.0 | 0.013 | 3 × 10$^3$ |
| 16 | B5TT-TIPS-An | *—bithienyl | 8.0/2.0/97.2 | 0.07 | 5 × 10$^3$ |
| 17 | B5FT-TIPS-An | *—thienyl—CHO | 0.7/2.0/97.3 | 0.01 | 1 × 10$^2$ |

*SC: Small molecule semiconductor; PS: Polystyrene; BB: n-Butylbenzene.

I claim:

1. A coating composition comprising:
(a) a small molecule semiconductor of Formula (I)

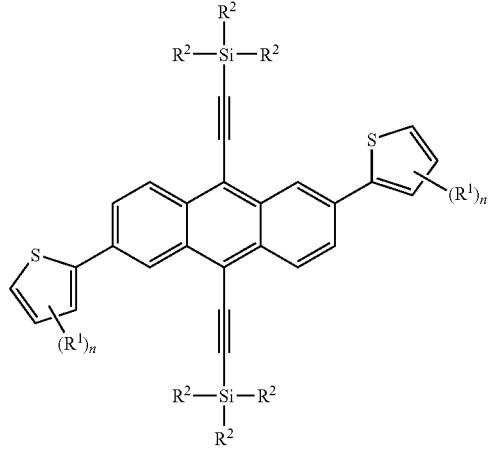

(I)

wherein
  each $R^1$ is independently alkyl, alkoxy, thioalkyl, hydroxyalkyl, heteroalkyl, alkenyl, alkynyl, aryl, aralkyl, halo, haloalkyl, trialkylsilyl, thienyl, formyl, acyl, alkoxycarbonyl, carboxy, aminocarbonyl, aminosulfonyl, or combination thereof;
  each n is independently an integer equal to 0, 1, 2, or 3; and
  each $R^2$ is independently alkyl, alkoxy, alkenyl, aryl, heteroaryl, aralkyl, heteroalkyl, heteroaralkyl, or hydroxyalkyl;
(b) an insulating polymer; and
(c) an organic solvent,
wherein the small molecule semiconductor of Formula (I) and the insulating polymer each have a solubility of at least 0.1 weight percent based on the total weight of the coating composition.

2. The coating composition of claim 1, wherein the small molecule semiconductor of Formula (I) comprises

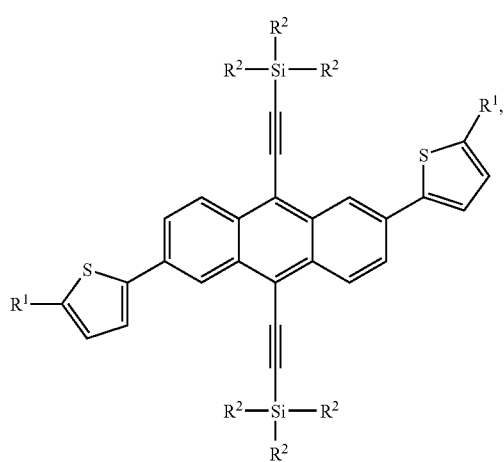

-continued

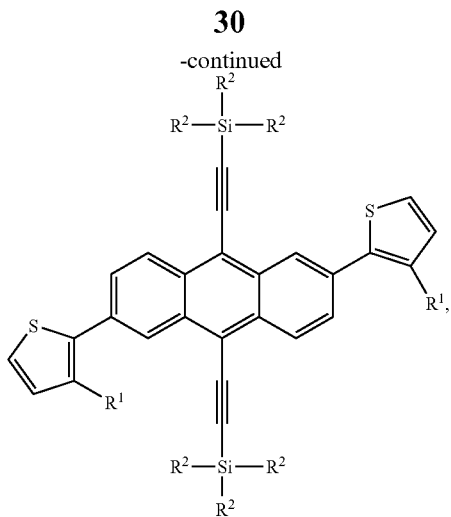

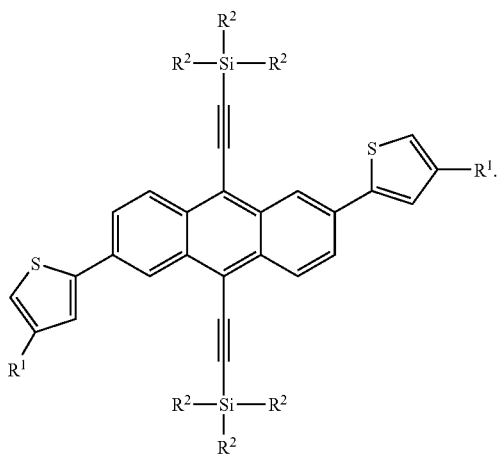

3. The coating composition of claim 1, wherein each $R^2$ is an alkyl having up to 10 carbon atoms.

4. The coating composition of claim 1, wherein each $R^1$ is an alkyl having up to 10 carbon atoms and each $R^2$ is an alkyl having up to 10 carbon atoms.

5. The coating composition of claim 1, wherein each $R^1$ is a formyl group or an acyl having up to 10 carbon atoms, wherein the acyl group is unsubstituted or substituted with a halo.

6. The coating composition of claim 1, wherein the insulating polymer comprises polystyrene, poly(α-methylstyrene), poly(methyl methacrylate), polyvinylphenol, poly(vinyl alcohol), poly(vinyl acetate), polyvinylchloride, polyvinyldenfluoride, cyanoethylpullulan, or poly(divinyltetramethyldisiloxane-bis(benzocyclobutene)).

7. The coating composition of claim 1, wherein the organic solvent comprises (a) benzene that is unsubstituted or substituted with at least one alkyl group, (b) an alkane that is substituted with at least one halo group, (c) benzene that is substituted with at least one halo group, (d) a ketone, (e) an ether, (f) an amide, or (g) benzene that is substituted with at least one alkoxy group.

8. A semiconductor device comprising a semiconductor layer comprising:

(a) a small molecule semiconductor of Formula (I)

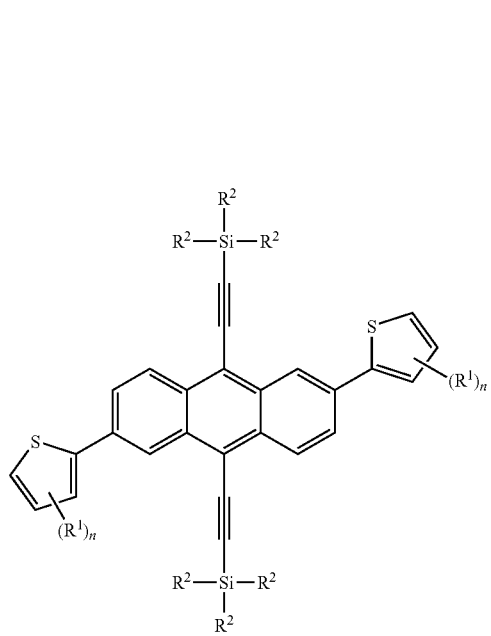

wherein
- each $R^1$ is independently alkyl, alkoxy, thioalkyl, hydroxyalkyl, heteroalkyl, alkenyl, alkynyl, aryl, aralkyl, halo, haloalkyl, trialkylsilyl, thienyl, formyl, acyl, alkoxycarbonyl, carboxy, aminocarbonyl, aminosulfonyl, or combination thereof;
- each n is independently an integer equal to 0, 1, 2, or 3; and
- each $R^2$ is independently hydrogen, alkyl, alkoxy, alkenyl, aryl, heteroaryl, aralkyl, heteroalkyl, heteroaralkyl, or hydroxyalkyl; and (b) an insulating polymer.

9. The semiconductor device of claim 8, further comprising a conducting layer, a dielectric layer, or a combination thereof adjacent to the semiconductor layer.

10. The semiconductor device of claim 8, wherein the semiconductor device comprises an organic thin film transistor.

11. The semiconductor device of claim 8, further comprising an electrode layer comprising a source electrode and a drain electrode that are separated from each other and that are both in contact with the semiconductor layer.

12. The semiconductor device of claim 8, further comprising a conducting layer adjacent to one surface of the semiconducting layer and a dielectric layer adjacent to an opposite surface of the semiconducting layer.

13. The semiconductor device of claim 8, wherein the small molecule semiconductor of Formula (I) comprises

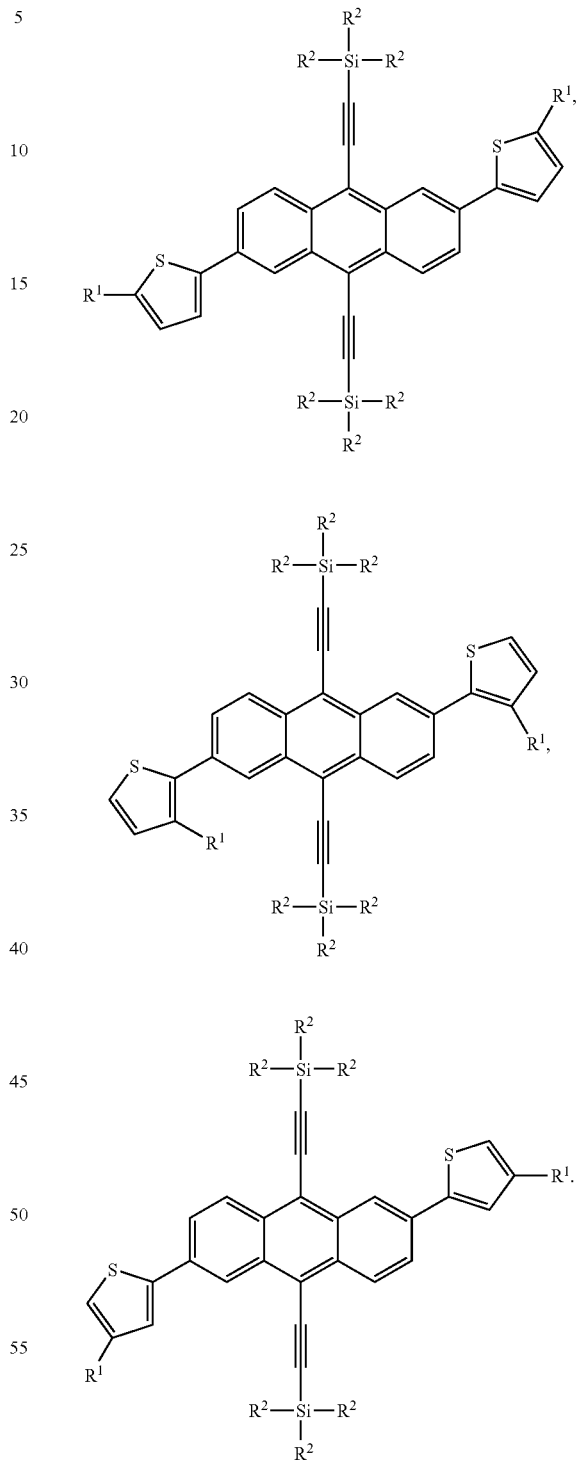

14. The semiconductor device of claim 8, wherein the insulating polymer comprises polystyrene, poly(α-methylstyrene), poly(methyl methacrylate), polyvinylphenol, poly(vinyl alcohol), poly(vinyl acetate), polyvinylchloride, polyvinyldenfluoride, cyanoethylpullulan, or poly(divinyltetramethyldisiloxane-bis(benzocyclobutene)).

15. A method of making a semiconductor device, the method comprising:
providing a semiconductor layer comprising
(a) a small molecule semiconductor of Formula (I)

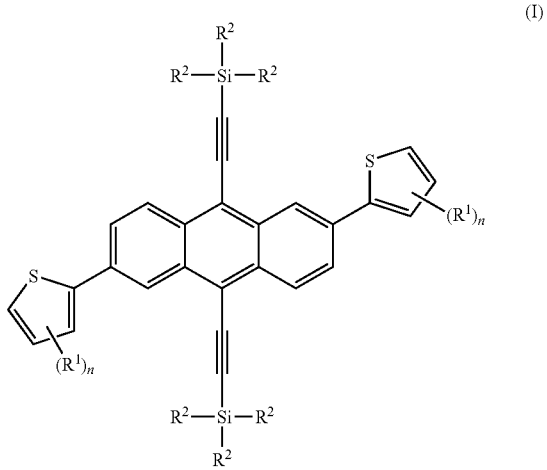

wherein
each $R^1$ is independently alkyl, alkoxy, thioalkyl, hydroxyalkyl, heteroalkyl, alkenyl, alkynyl, aryl, aralkyl, halo, haloalkyl, trialkylsilyl, thienyl, formyl, acyl, alkoxycarbonyl, carboxy, aminocarbonyl, aminosulfonyl, or combination thereof;
each n is independently an integer equal to 0, 1, 2, or 3; and
each $R^2$ is independently alkyl, alkoxy, alkenyl, aryl, heteroaryl, aralkyl, heteroalkyl, heteroaralkyl, or hydroxyalkyl; and
(b) an insulating polymer.

16. The method of claim 15, further comprising providing a first layer adjacent to the semiconductor layer, the first layer comprising a conducting layer or a dielectric layer.

17. The method of claim 15, wherein the semiconductor device comprises an organic thin film transistor comprising multiple layers arranged in the following order:
a gate electrode;
a gate dielectric layer;
the semiconductor layer; and
an electrode layer comprising a source electrode and a drain electrode, wherein the source electrode and the drain electrode are separated from each other and wherein the semiconductor layer contacts both the drain electrode and the source electrode.

18. The method of claim 15, wherein the semiconductor device comprises an organic thin film transistor comprising multiple layers arranged in the following order:
a gate electrode;
a gate dielectric layer;
an electrode layer comprising a source electrode and a drain electrode, wherein the source electrode and the drain electrode are separated from each other; and
the semiconductor layer in contact with both the source electrode and the drain electrode.

19. The method of claim 15, wherein the insulating polymer comprises polystyrene, poly(α-methylstyrene), poly(methyl methacrylate), polyvinylphenol, poly(vinyl alcohol), poly(vinyl acetate), polyvinylchloride, polyvinyldenfluoride, cyanoethylpullulan, or poly(divinyltetramethyldisiloxane-bis(benzocyclobutene)).

20. The method of claim 15, wherein providing the semiconductor layer comprises applying a coating composition to a surface of another layer of the semiconductor device, the coating composition comprising the small molecule semiconductor of Formula (I), the insulating polymer, and an organic solvent that dissolves at least a portion of both the small molecule semiconductor and the insulating polymer.

21. The method of claim 20, wherein the small molecule semiconductor of Formula (I) and the insulating polymer each have a concentration of at least 0.1 weight percent based on a total weight of the coating composition.

22. The method of claim 20, further comprising removing at least a portion of the organic solvent after applying the coating composition.

* * * * *

UNITED STATES PATENT AND TRADEMARK OFFICE
CERTIFICATE OF CORRECTION

PATENT NO.        : 8,178,873 B2
APPLICATION NO.   : 12/808003
DATED             : May 15, 2012
INVENTOR(S)       : Peiwang Zhu It is certified that error appears in the above-identified patent and that said Letters Patent is hereby corrected as shown below:

Title Page 2, Column 2 Item (56) (Other Publications)
Line 13, delete "alkylthiophen" and insert -- alkylthiophene --, therefor.

Column 1
Line 20, after "BACKGROUND" delete "ART".

Column 4
Line 26, after "bond" insert -- . --.

Column 5
Line 66, delete "thereof" and insert -- thereof. --, therefor.

Signed and Sealed this
Twenty-first Day of August, 2012

David J. Kappos
*Director of the United States Patent and Trademark Office*

Column 8

Lines 51-64 (approx.), delete " 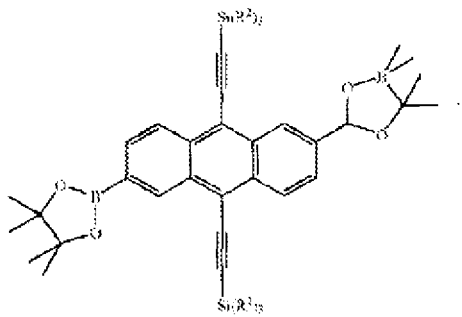 " and insert

-- 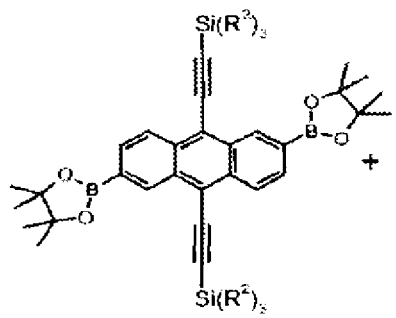 --, therefor.

Column 9
Line 60, delete "2-(5-bromothien2-yl)" and insert -- 2-(5-bromothien-2-yl) --, therefor.

Column 11
Line 33, delete "methylcyclopentone," and insert -- methylcyclopentanone, --, therefor.

Column 17
Line 62 (approx.), delete "hexamethyldisilanzane" and insert -- hexamethyldisilazane --, therefor.

Column 19
Line 39 (approx.), delete "dibromoanthraquininone" and insert -- dibromoanthraquinone --, therefor.

CERTIFICATE OF CORRECTION (continued)
U.S. Pat. No. 8,178,873 B2

Column 30

Line 19 (approx.), in Claim 2, after " 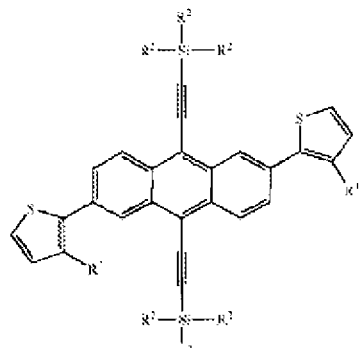 " insert -- or --.

Column 32

Line 41 (approx.), in Claim 13, after " 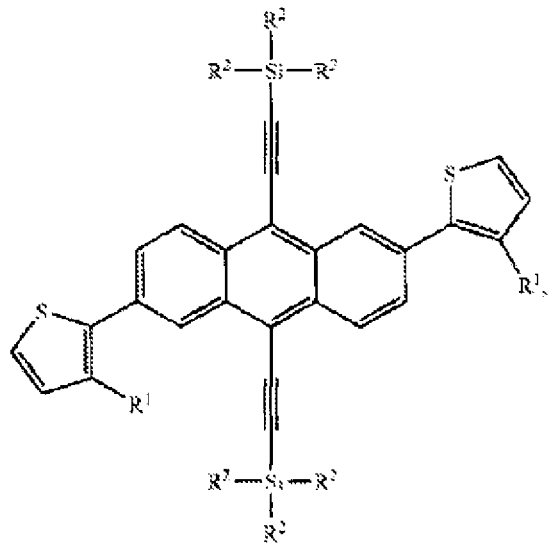 " insert -- or --.